US012567763B2

(12) United States Patent
Yamamoto et al.

(10) Patent No.: US 12,567,763 B2
(45) Date of Patent: Mar. 3, 2026

(54) POWER SUPPLY CONTROL DEVICE

(71) Applicant: Hitachi Astemo, Ltd., Hitachinaka (JP)

(72) Inventors: Masafumi Yamamoto, Hitachinaka (JP); Takumi Masubuchi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 18/285,670

(22) PCT Filed: Aug. 20, 2021

(86) PCT No.: PCT/JP2021/030657
§ 371 (c)(1),
(2) Date: Oct. 5, 2023

(87) PCT Pub. No.: WO2023/021702
PCT Pub. Date: Feb. 23, 2023

(65) Prior Publication Data
US 2024/0186822 A1      Jun. 6, 2024

(51) Int. Cl.
H02J 9/06          (2006.01)
G11C 5/14          (2006.01)
(52) U.S. Cl.
CPC .............. H02J 9/068 (2020.01); *G11C 5/141* (2013.01)
(58) Field of Classification Search
CPC ... H02J 9/068; H02J 1/00; H02J 1/102; G11C 5/141; G06F 11/2015; G06F 1/30
See application file for complete search history.

(56) References Cited

U.S. PATENT DOCUMENTS

| | | | |
|---|---|---|---|
| 6,501,196 B1 * | 12/2002 | Lo ............................ | H02J 9/06 307/64 |
| 7,596,706 B2 | 9/2009 | Fuseya | |
| 7,877,622 B2 | 1/2011 | Gruendler | |
| 2007/0226557 A1 | 9/2007 | Fuseya | |
| 2009/0158070 A1 | 6/2009 | Gruendler | |
| 2012/0086269 A1 * | 4/2012 | Nakano ................... | H02J 9/062 307/23 |

(Continued)

FOREIGN PATENT DOCUMENTS

| | | |
|---|---|---|
| JP | 2007-259661 A | 10/2007 |
| JP | 2009-55686 A | 3/2009 |

(Continued)

OTHER PUBLICATIONS

International Search Report (PCT/ISA/210) issued in PCT Application No. PCT/JP2021/030657 dated Nov. 9, 2021 with English translation (4 pages).

(Continued)

*Primary Examiner* — Rexford N Barnie
*Assistant Examiner* — Rasem Mourad
(74) *Attorney, Agent, or Firm* — Crowell & Moring LLP

(57) ABSTRACT
A power supply control device includes: a plurality of power supply circuits; a control circuit that controls the power supply circuits; an output current monitor that monitors output currents of the power supply circuits; and a storage unit in which any one of a plurality of operation modes for controlling the power supply circuits is settable. The control circuit controls the power supply circuits based on the operation mode set in the storage unit and the output currents monitored by the output current monitor.

7 Claims, 30 Drawing Sheets

(56) References Cited

U.S. PATENT DOCUMENTS

| | | | |
|---|---|---|---|
| 2014/0346878 A1* | 11/2014 | Umeyama | G06F 1/263 |
| | | | 307/52 |
| 2017/0269656 A1* | 9/2017 | Seki | G06F 11/2015 |
| 2021/0194273 A1* | 6/2021 | Huang | H02J 1/086 |
| 2021/0288519 A1* | 9/2021 | Kim | H02J 3/36 |

FOREIGN PATENT DOCUMENTS

| | | |
|---|---|---|
| JP | 2009-146392 A | 7/2009 |
| JP | 2017-16342 A | 9/2017 |

OTHER PUBLICATIONS

Japanese-language Written Opinion (PCT/ISA/237) issued in PCT Application No. PCT/JP2021/030657 dated Nov. 9, 2021 with English translation (5 pages).

* cited by examiner

*FIG. 2*

| No. | REGISTER NAME | BIT NUMBER | CONTENTS |
|---|---|---|---|
| 1 | OPERATION MODE REGISTER | 3bit | SETTING POWER SUPPLY CONTROL IC OPERATION MODE |
| 2 | INTELLIGENT THRESHOLD REGISTER | 5bit × NUMBER OF POWER SUPPLY CIRCUITS | SETTING THRESHOLD OF OUTPUT CURRENT WHEN EXECUTING INTELLIGENT FUNCTION |
| 3 | INTELLIGENT DISTRIBUTION DESTINATION REGISTER | Nbit | SELECTING POWER SUPPLY CIRCUIT OF DISTRIBUTION DESTINATION IN NON-REDUNDANCY MODE (INTELLIGENT FUNCTION IS USED) <br> -DISTRIBUTABLE ONLY WITH SAME VOLTAGE SYSTEM <br> -BIT NUMBER DEPENDS ON NUMBER OF POWER SUPPLY CIRCUIT GROUPS AND NUMBER OF POWER SUPPLY CIRCUITS |
| 4 | INTELLIGENT DISTRIBUTED CURRENT VALUE REGISTER | 4bit × NUMBER OF POWER SUPPLY CIRCUITS | SETTING DISTRIBUTED CURRENT VALUE WHEN EXECUTING INTELLIGENT FUNCTION <br> -DISTRIBUTABLE ONLY WITH SAME VOLTAGE SYSTEM |
| 5 | SEAMLESS THRESHOLD REGISTER | 5bit × NUMBER OF POWER SUPPLY CIRCUITS | SETTING THRESHOLD OF OUTPUT CURRENT WHEN EXECUTING SEAMLESS FUNCTION |
| 6 | SEAMLESS DISTRIBUTED CURRENT VALUE REGISTER | 4bit × NUMBER OF POWER SUPPLY CIRCUITS | SETTING DISTRIBUTED CURRENT VALUE WHEN EXECUTING SEAMLESS FUNCTION <br> -DISTRIBUTABLE ONLY WITH SAME VOLTAGE SYSTEM |

FIG. 3

| OPERATION MODE REGISTER (3bit) |
|---|

| REGISTER VALUE | OPERATION MODE |
|---|---|
| 101 | REDUNDANCY MODE (SEAMLESS FUNCTION) |
| 110 | REDUNDANCY MODE (INTELLIGENT FUNCTION) |
| 111 | REDUNDANCY MODE (SEAMLESS FUNCTION/INTELLIGENT FUNCTION) |
| 000 | NON-REDUNDANCY MODE (NORMAL OPERATION) |
| 010 | NON-REDUNDANCY MODE (INTELLIGENT FUNCTION IS USED) |
| OTHERS | NOT USED (SELECTING NON-REDUNDANCY MODE (NORMAL OPERATION)) |

FIG. 4

| INTELLIGENT THRESHOLD REGISTER (5bit × NUMBER OF POWER SUPPLY CIRCUITS) |
|---|

| REGISTER VALUE | CURRENT THRESHOLD |
|---|---|
| 00000 | 0A |
| 00001 | 0.1A |
| 00010 | 0.2A |
| ... | ... |
| 10100 | 2.0A |
| OTHERS | NOT USED (SELECTING 0A) |

FIG. 5

| INTELLIGENT DISTRIBUTION DESTINATION REGISTER (Nbit) |
|---|

- IF NUMBER OF POWER SUPPLY CIRCUIT GROUPS=2, AND NUMBER OF POWER SUPPLY CIRCUITS=3, REGISTER: 4bits
- ONLY NON-REDUNDANCY MODE (INTELLIGENT FUNCTION IS USED) IS VALID
- DISTRIBUTABLE ONLY WITH SAME VOLTAGE SYSTEM

| REGISTER VALUE | DISTRIBUTION DESTINATION |
|---|---|
| 00xx | NOT DISTRIBUTED |
| 0100 | DISTRIBUTED TO FIRST POWER SUPPLY CIRCUIT 311 |
| 0101 | DISTRIBUTED TO SECOND POWER SUPPLY CIRCUIT 312 |
| 0110 | DISTRIBUTED TO THIRD POWER SUPPLY CIRCUIT 313 |
| 1000 | DISTRIBUTED TO FIRST POWER SUPPLY CIRCUIT 321 |
| 1001 | DISTRIBUTED TO SECOND POWER SUPPLY CIRCUIT 322 |
| 1010 | DISTRIBUTED TO THIRD POWER SUPPLY CIRCUIT 323 |
| OTHERS | NOT USED (SELECTING "NOT DISTRIBUTED") |

*FIG. 6*

| INTELLIGENT DISTRIBUTED CURRENT VALUE REGISTER (4bit × NUMBER OF POWER SUPPLY CIRCUITS) |
|---|
| -DISTRIBUTABLE ONLY WITH SAME VOLTAGE SYSTEM |

| REGISTER VALUE | DISTRIBUTED CURRENT VALUE |
|---|---|
| 0000 | 0A |
| 0001 | 0.025A |
| 0010 | 0.050A |
| ... | ... |
| 1000 | 0.200A |
| OTHERS | NOT USED (SELECTING 0A) |

*FIG. 7*

| SEAMLESS THRESHOLD REGISTER (5bit × NUMBER OF POWER SUPPLY CIRCUITS) |
|---|

| REGISTER VALUE | CURRENT THRESHOLD |
|---|---|
| 00000 | 0A |
| 00001 | 0.1A |
| 00010 | 0.2A |
| ... | ... |
| 10100 | 2.0A |
| OTHERS | NOT USED (SELECTING 0A) |

*FIG. 8*

| SEAMLESS DISTRIBUTED CURRENT VALUE REGISTER (4bit × NUMBER OF POWER SUPPLY CIRCUITS) |
|---|
| -DISTRIBUTABLE ONLY WITH SAME VOLTAGE SYSTEM |

| REGISTER VALUE | DISTRIBUTED CURRENT VALUE |
|---|---|
| 0000 | 0A |
| 0001 | 0.025A |
| 0010 | 0.050A |
| ... | ... |
| 1000 | 0.200A |
| OTHERS | NOT USED (SELECTING 0A) |

FIG. 16

| OPERATION MODE REGISTER (3bit) |
| --- |

| REGISTER VALUE | OPERATION MODE |
| --- | --- |
| 101 | REDUNDANCY MODE (SEAMLESS FUNCTION) |

| INTELLIGENT THRESHOLD REGISTER (5bit × NUMBER OF POWER SUPPLY CIRCUITS) |
| --- |

| REGISTER VALUE | CURRENT THRESHOLD | CORRESPONDING POWER SUPPLY CIRCUIT |
| --- | --- | --- |
| SETTING NOT REQUIRED | – | FIRST POWER SUPPLY CIRCUIT |
| SETTING NOT REQUIRED | – | SECOND POWER SUPPLY CIRCUIT |
| SETTING NOT REQUIRED | – | THIRD POWER SUPPLY CIRCUIT |

| INTELLIGENT DISTRIBUTION DESTINATION REGISTER (Nbit) |
| --- |

- ONLY NON-REDUNDANCY MODE (INTELLIGENT FUNCTION IS USED) IS VALID
- DISTRIBUTABLE ONLY WITH SAME VOLTAGE SYSTEM

| REGISTER VALUE | DISTRIBUTION DESTINATION | CORRESPONDING POWER SUPPLY CIRCUIT |
| --- | --- | --- |
| SETTING NOT REQUIRED | – | FIRST POWER SUPPLY CIRCUIT |
| SETTING NOT REQUIRED | – | SECOND POWER SUPPLY CIRCUIT |
| SETTING NOT REQUIRED | – | THIRD POWER SUPPLY CIRCUIT |

| INTELLIGENT DISTRIBUTED CURRENT VALUE REGISTER (4bit × NUMBER OF POWER SUPPLY CIRCUITS) |
| --- |

- DISTRIBUTABLE ONLY WITH SAME VOLTAGE SYSTEM

| REGISTER VALUE | DISTRIBUTED CURRENT VALUE | CORRESPONDING POWER SUPPLY CIRCUIT |
| --- | --- | --- |
| SETTING NOT REQUIRED | – | FIRST POWER SUPPLY CIRCUIT |
| SETTING NOT REQUIRED | – | SECOND POWER SUPPLY CIRCUIT |
| SETTING NOT REQUIRED | – | THIRD POWER SUPPLY CIRCUIT |

| SEAMLESS THRESHOLD REGISTER (5bit × NUMBER OF POWER SUPPLY CIRCUITS) |
| --- |

| REGISTER VALUE | CURRENT THRESHOLD | CORRESPONDING POWER SUPPLY CIRCUIT |
| --- | --- | --- |
| 01010 | 1.0A | FIRST POWER SUPPLY CIRCUIT |
| 01010 | 1.0A | SECOND POWER SUPPLY CIRCUIT |
| 01010 | 1.0A | THIRD POWER SUPPLY CIRCUIT |

| SEAMLESS DISTRIBUTED CURRENT VALUE REGISTER (4bit × NUMBER OF POWER SUPPLY CIRCUITS) |
| --- |

- DISTRIBUTABLE ONLY WITH SAME VOLTAGE SYSTEM

| REGISTER VALUE | DISTRIBUTED CURRENT VALUE | CORRESPONDING POWER SUPPLY CIRCUIT |
| --- | --- | --- |
| 1000 | 0.200A | FIRST POWER SUPPLY CIRCUIT |
| 1000 | 0.200A | SECOND POWER SUPPLY CIRCUIT |
| 1000 | 0.200A | THIRD POWER SUPPLY CIRCUIT |

FIG. 19

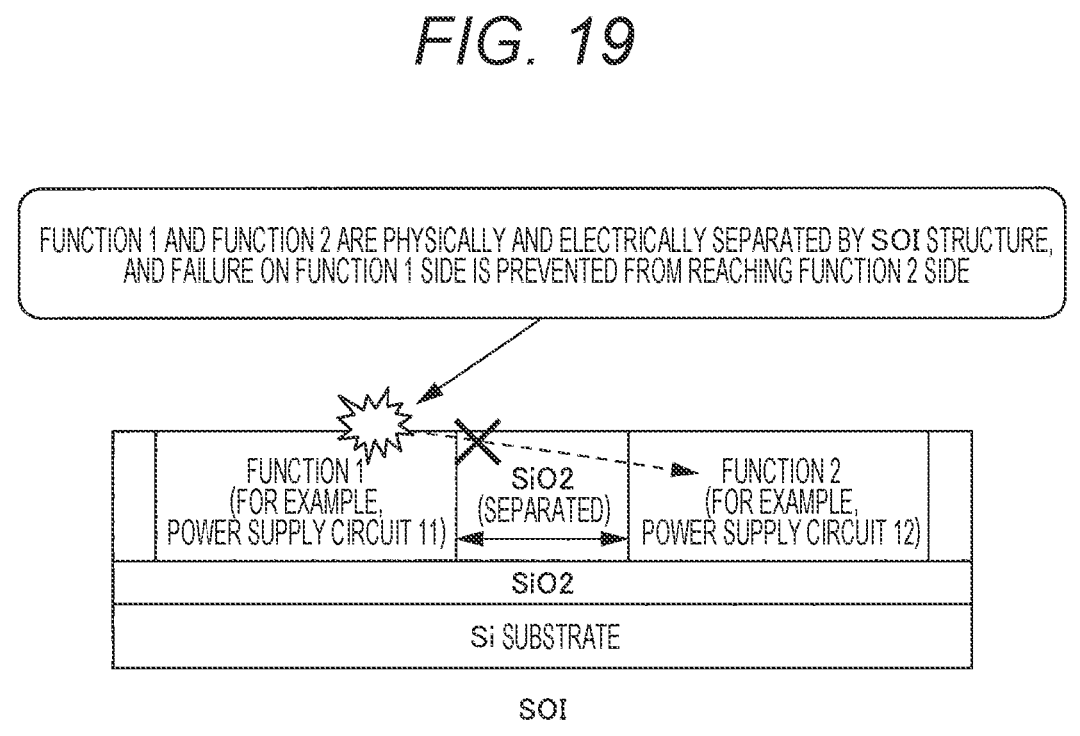

FUNCTION 1 AND FUNCTION 2 ARE PHYSICALLY AND ELECTRICALLY SEPARATED BY SOI STRUCTURE, AND FAILURE ON FUNCTION 1 SIDE IS PREVENTED FROM REACHING FUNCTION 2 SIDE

FUNCTION 1
(FOR EXAMPLE,
POWER SUPPLY CIRCUIT 11)

SiO2
(SEPARATED)

FUNCTION 2
(FOR EXAMPLE,
POWER SUPPLY CIRCUIT 12)

SiO2

Si SUBSTRATE

SOI

FIG. 23

| OPERATION MODE REGISTER (3bit) |
| --- |

| REGISTER VALUE | OPERATION MODE |
| --- | --- |
| 110 | REDUNDANCY MODE (INTELLIGENT FUNCTION) |

| INTELLIGENT THRESHOLD REGISTER (5bit × NUMBER OF POWER SUPPLY CIRCUITS) |
| --- |

| REGISTER VALUE | CURRENT THRESHOLD | CORRESPONDING POWER SUPPLY CIRCUIT |
| --- | --- | --- |
| 10100 | 2.0A | FIRST POWER SUPPLY CIRCUIT |
| 10100 | 2.0A | SECOND POWER SUPPLY CIRCUIT |
| 10100 | 2.0A | THIRD POWER SUPPLY CIRCUIT |

INTELLIGENT DISTRIBUTION DESTINATION REGISTER (Nbit)

-ONLY NON-REDUNDANCY MODE (INTELLIGENT FUNCTION IS USED) IS VALID
-DISTRIBUTABLE ONLY WITH SAME VOLTAGE SYSTEM

| REGISTER VALUE | DISTRIBUTION DESTINATION | CORRESPONDING POWER SUPPLY CIRCUIT |
| --- | --- | --- |
| SETTING NOT REQUIRED | – | FIRST POWER SUPPLY CIRCUIT |
| SETTING NOT REQUIRED | – | SECOND POWER SUPPLY CIRCUIT |
| SETTING NOT REQUIRED | – | THIRD POWER SUPPLY CIRCUIT |

INTELLIGENT DISTRIBUTED CURRENT VALUE REGISTER (4bit × NUMBER OF POWER SUPPLY CIRCUITS)

-DISTRIBUTABLE ONLY WITH SAME VOLTAGE SYSTEM

| REGISTER VALUE | DISTRIBUTED CURRENT VALUE | CORRESPONDING POWER SUPPLY CIRCUIT |
| --- | --- | --- |
| 0100 | 0.100A | FIRST POWER SUPPLY CIRCUIT |
| 0100 | 0.100A | SECOND POWER SUPPLY CIRCUIT |
| 0100 | 0.100A | THIRD POWER SUPPLY CIRCUIT |

| SEAMLESS THRESHOLD REGISTER (5bit × NUMBER OF POWER SUPPLY CIRCUITS) |
| --- |

| REGISTER VALUE | CURRENT THRESHOLD | CORRESPONDING POWER SUPPLY CIRCUIT |
| --- | --- | --- |
| SETTING NOT REQUIRED | – | FIRST POWER SUPPLY CIRCUIT |
| SETTING NOT REQUIRED | – | SECOND POWER SUPPLY CIRCUIT |
| SETTING NOT REQUIRED | – | THIRD POWER SUPPLY CIRCUIT |

SEAMLESS DISTRIBUTED CURRENT VALUE REGISTER (4bit × NUMBER OF POWER SUPPLY CIRCUITS)

-DISTRIBUTABLE ONLY WITH SAME VOLTAGE SYSTEM

| REGISTER VALUE | DISTRIBUTED CURRENT VALUE | CORRESPONDING POWER SUPPLY CIRCUIT |
| --- | --- | --- |
| SETTING NOT REQUIRED | – | FIRST POWER SUPPLY CIRCUIT |
| SETTING NOT REQUIRED | – | SECOND POWER SUPPLY CIRCUIT |
| SETTING NOT REQUIRED | – | THIRD POWER SUPPLY CIRCUIT |

FIG. 27

| OPERATION MODE REGISTER (3bit) |
| --- |

| REGISTER VALUE | OPERATION MODE |
| --- | --- |
| 111 | REDUNDANCY MODE (INTELLIGENT FUNCTION/SEAMLESS FUNCTION) |

| INTELLIGENT THRESHOLD REGISTER (5bit × NUMBER OF POWER SUPPLY CIRCUITS) |
| --- |

| REGISTER VALUE | CURRENT THRESHOLD | CORRESPONDING POWER SUPPLY CIRCUIT |
| --- | --- | --- |
| 10100 | 2.0A | FIRST POWER SUPPLY CIRCUIT |
| 10100 | 2.0A | SECOND POWER SUPPLY CIRCUIT |
| 10100 | 2.0A | THIRD POWER SUPPLY CIRCUIT |

INTELLIGENT DISTRIBUTION DESTINATION REGISTER (Nbit)

- ONLY NON-REDUNDANCY MODE (INTELLIGENT FUNCTION IS USED) IS VALID
- DISTRIBUTABLE ONLY WITH SAME VOLTAGE SYSTEM

| REGISTER VALUE | DISTRIBUTION DESTINATION | CORRESPONDING POWER SUPPLY CIRCUIT |
| --- | --- | --- |
| SETTING NOT REQUIRED | – | FIRST POWER SUPPLY CIRCUIT |
| SETTING NOT REQUIRED | – | SECOND POWER SUPPLY CIRCUIT |
| SETTING NOT REQUIRED | – | THIRD POWER SUPPLY CIRCUIT |

INTELLIGENT DISTRIBUTED CURRENT VALUE REGISTER (4bit × NUMBER OF POWER SUPPLY CIRCUITS)

- DISTRIBUTABLE ONLY WITH SAME VOLTAGE SYSTEM

| REGISTER VALUE | DISTRIBUTED CURRENT VALUE | CORRESPONDING POWER SUPPLY CIRCUIT |
| --- | --- | --- |
| 0100 | 0.100A | FIRST POWER SUPPLY CIRCUIT |
| 0100 | 0.100A | SECOND POWER SUPPLY CIRCUIT |
| 0100 | 0.100A | THIRD POWER SUPPLY CIRCUIT |

| SEAMLESS THRESHOLD REGISTER (5bit × NUMBER OF POWER SUPPLY CIRCUITS) |
| --- |

| REGISTER VALUE | CURRENT THRESHOLD | CORRESPONDING POWER SUPPLY CIRCUIT |
| --- | --- | --- |
| 01010 | 1.0A | FIRST POWER SUPPLY CIRCUIT |
| 01010 | 1.0A | SECOND POWER SUPPLY CIRCUIT |
| 01010 | 1.0A | THIRD POWER SUPPLY CIRCUIT |

SEAMLESS DISTRIBUTED CURRENT VALUE REGISTER (4bit × NUMBER OF POWER SUPPLY CIRCUITS)

- DISTRIBUTABLE ONLY WITH SAME VOLTAGE SYSTEM

| REGISTER VALUE | DISTRIBUTED CURRENT VALUE | CORRESPONDING POWER SUPPLY CIRCUIT |
| --- | --- | --- |
| 1000 | 0.200A | FIRST POWER SUPPLY CIRCUIT |
| 1000 | 0.200A | SECOND POWER SUPPLY CIRCUIT |
| 1000 | 0.200A | THIRD POWER SUPPLY CIRCUIT |

FIG. 30

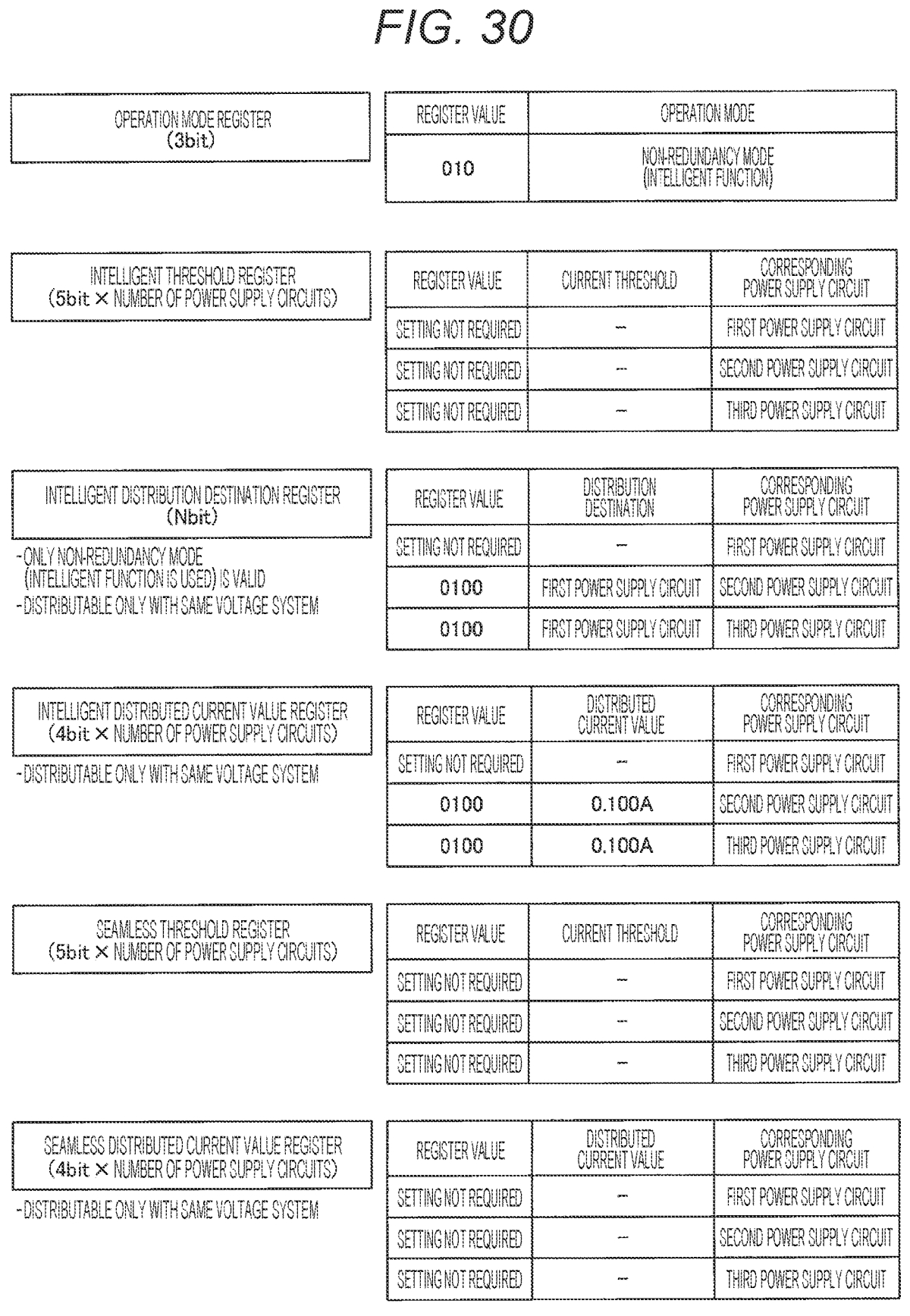

| OPERATION MODE REGISTER (3bit) |
|---|

| REGISTER VALUE | OPERATION MODE |
|---|---|
| 010 | NON-REDUNDANCY MODE (INTELLIGENT FUNCTION) |

| INTELLIGENT THRESHOLD REGISTER (5bit × NUMBER OF POWER SUPPLY CIRCUITS) |
|---|

| REGISTER VALUE | CURRENT THRESHOLD | CORRESPONDING POWER SUPPLY CIRCUIT |
|---|---|---|
| SETTING NOT REQUIRED | — | FIRST POWER SUPPLY CIRCUIT |
| SETTING NOT REQUIRED | — | SECOND POWER SUPPLY CIRCUIT |
| SETTING NOT REQUIRED | — | THIRD POWER SUPPLY CIRCUIT |

| INTELLIGENT DISTRIBUTION DESTINATION REGISTER (Nbit) |
|---|
| -ONLY NON-REDUNDANCY MODE (INTELLIGENT FUNCTION IS USED) IS VALID |
| -DISTRIBUTABLE ONLY WITH SAME VOLTAGE SYSTEM |

| REGISTER VALUE | DISTRIBUTION DESTINATION | CORRESPONDING POWER SUPPLY CIRCUIT |
|---|---|---|
| SETTING NOT REQUIRED | — | FIRST POWER SUPPLY CIRCUIT |
| 0100 | FIRST POWER SUPPLY CIRCUIT | SECOND POWER SUPPLY CIRCUIT |
| 0100 | FIRST POWER SUPPLY CIRCUIT | THIRD POWER SUPPLY CIRCUIT |

| INTELLIGENT DISTRIBUTED CURRENT VALUE REGISTER (4bit × NUMBER OF POWER SUPPLY CIRCUITS) |
|---|
| -DISTRIBUTABLE ONLY WITH SAME VOLTAGE SYSTEM |

| REGISTER VALUE | DISTRIBUTED CURRENT VALUE | CORRESPONDING POWER SUPPLY CIRCUIT |
|---|---|---|
| SETTING NOT REQUIRED | — | FIRST POWER SUPPLY CIRCUIT |
| 0100 | 0.100A | SECOND POWER SUPPLY CIRCUIT |
| 0100 | 0.100A | THIRD POWER SUPPLY CIRCUIT |

| SEAMLESS THRESHOLD REGISTER (5bit × NUMBER OF POWER SUPPLY CIRCUITS) |
|---|

| REGISTER VALUE | CURRENT THRESHOLD | CORRESPONDING POWER SUPPLY CIRCUIT |
|---|---|---|
| SETTING NOT REQUIRED | — | FIRST POWER SUPPLY CIRCUIT |
| SETTING NOT REQUIRED | — | SECOND POWER SUPPLY CIRCUIT |
| SETTING NOT REQUIRED | — | THIRD POWER SUPPLY CIRCUIT |

| SEAMLESS DISTRIBUTED CURRENT VALUE REGISTER (4bit × NUMBER OF POWER SUPPLY CIRCUITS) |
|---|
| -DISTRIBUTABLE ONLY WITH SAME VOLTAGE SYSTEM |

| REGISTER VALUE | DISTRIBUTED CURRENT VALUE | CORRESPONDING POWER SUPPLY CIRCUIT |
|---|---|---|
| SETTING NOT REQUIRED | — | FIRST POWER SUPPLY CIRCUIT |
| SETTING NOT REQUIRED | — | SECOND POWER SUPPLY CIRCUIT |
| SETTING NOT REQUIRED | — | THIRD POWER SUPPLY CIRCUIT |

FIG. 33

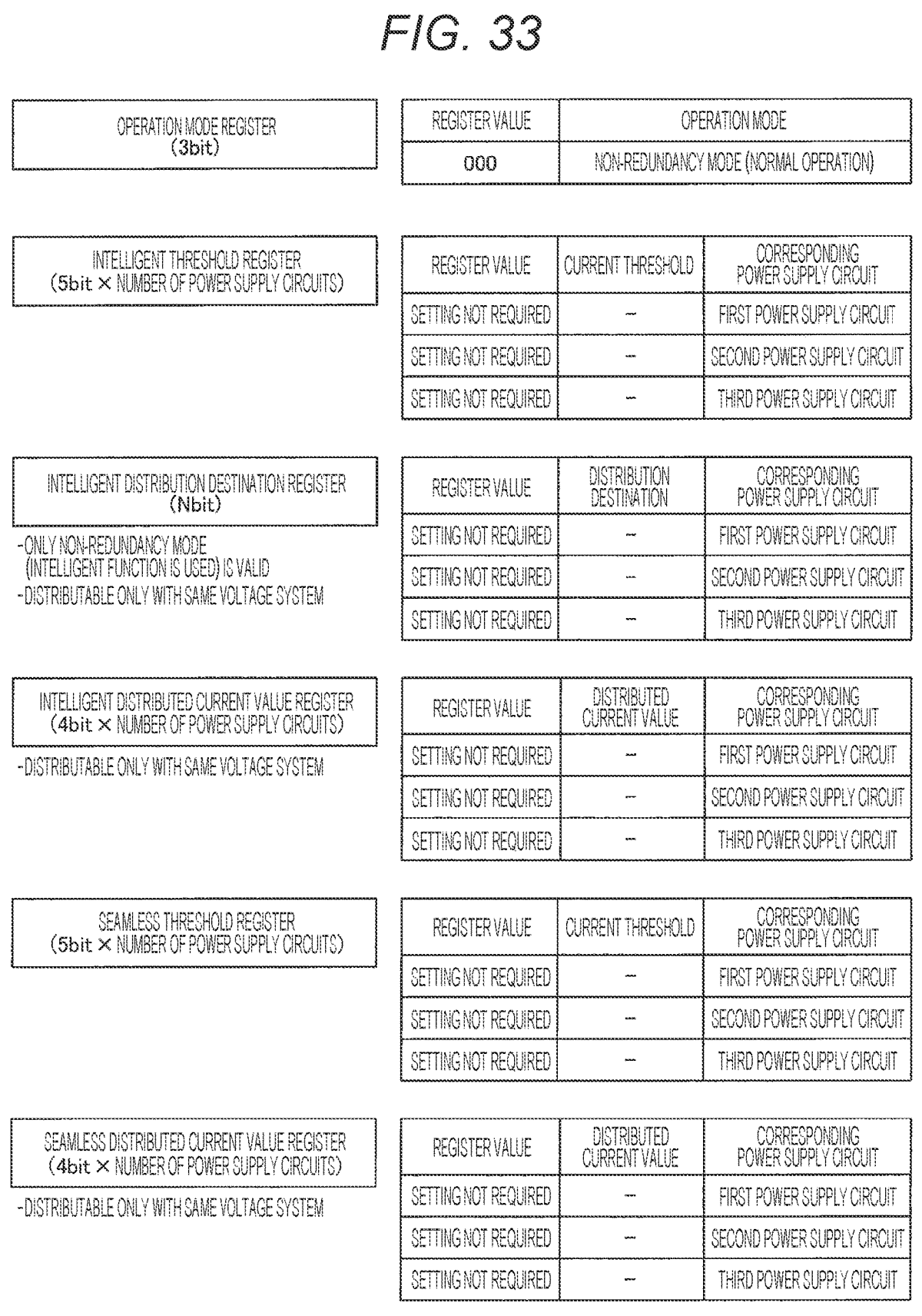

| OPERATION MODE REGISTER (3bit) |
|---|

| REGISTER VALUE | OPERATION MODE |
|---|---|
| 000 | NON-REDUNDANCY MODE (NORMAL OPERATION) |

| INTELLIGENT THRESHOLD REGISTER (5bit × NUMBER OF POWER SUPPLY CIRCUITS) |
|---|

| REGISTER VALUE | CURRENT THRESHOLD | CORRESPONDING POWER SUPPLY CIRCUIT |
|---|---|---|
| SETTING NOT REQUIRED | — | FIRST POWER SUPPLY CIRCUIT |
| SETTING NOT REQUIRED | — | SECOND POWER SUPPLY CIRCUIT |
| SETTING NOT REQUIRED | — | THIRD POWER SUPPLY CIRCUIT |

INTELLIGENT DISTRIBUTION DESTINATION REGISTER (Nbit)

-ONLY NON-REDUNDANCY MODE (INTELLIGENT FUNCTION IS USED) IS VALID
-DISTRIBUTABLE ONLY WITH SAME VOLTAGE SYSTEM

| REGISTER VALUE | DISTRIBUTION DESTINATION | CORRESPONDING POWER SUPPLY CIRCUIT |
|---|---|---|
| SETTING NOT REQUIRED | — | FIRST POWER SUPPLY CIRCUIT |
| SETTING NOT REQUIRED | — | SECOND POWER SUPPLY CIRCUIT |
| SETTING NOT REQUIRED | — | THIRD POWER SUPPLY CIRCUIT |

INTELLIGENT DISTRIBUTED CURRENT VALUE REGISTER (4bit × NUMBER OF POWER SUPPLY CIRCUITS)

-DISTRIBUTABLE ONLY WITH SAME VOLTAGE SYSTEM

| REGISTER VALUE | DISTRIBUTED CURRENT VALUE | CORRESPONDING POWER SUPPLY CIRCUIT |
|---|---|---|
| SETTING NOT REQUIRED | — | FIRST POWER SUPPLY CIRCUIT |
| SETTING NOT REQUIRED | — | SECOND POWER SUPPLY CIRCUIT |
| SETTING NOT REQUIRED | — | THIRD POWER SUPPLY CIRCUIT |

| SEAMLESS THRESHOLD REGISTER (5bit × NUMBER OF POWER SUPPLY CIRCUITS) |
|---|

| REGISTER VALUE | CURRENT THRESHOLD | CORRESPONDING POWER SUPPLY CIRCUIT |
|---|---|---|
| SETTING NOT REQUIRED | — | FIRST POWER SUPPLY CIRCUIT |
| SETTING NOT REQUIRED | — | SECOND POWER SUPPLY CIRCUIT |
| SETTING NOT REQUIRED | — | THIRD POWER SUPPLY CIRCUIT |

SEAMLESS DISTRIBUTED CURRENT VALUE REGISTER (4bit × NUMBER OF POWER SUPPLY CIRCUITS)

-DISTRIBUTABLE ONLY WITH SAME VOLTAGE SYSTEM

| REGISTER VALUE | DISTRIBUTED CURRENT VALUE | CORRESPONDING POWER SUPPLY CIRCUIT |
|---|---|---|
| SETTING NOT REQUIRED | — | FIRST POWER SUPPLY CIRCUIT |
| SETTING NOT REQUIRED | — | SECOND POWER SUPPLY CIRCUIT |
| SETTING NOT REQUIRED | — | THIRD POWER SUPPLY CIRCUIT |

POWER SUPPLY CONTROL DEVICE

TECHNICAL FIELD

The present invention relates to a power supply control device that is an integrated circuit used to perform power supply control of a semiconductor element.

BACKGROUND ART

Integration of electronic control units (ECUs) in a vehicle architecture has been studied. Therefore, also in an in-vehicle semiconductor device, a power supply control device is required to have a redundancy function for continuing power supply even when a failure such as pin opening or disconnection occurs from the viewpoint of functional safety.

Examples of a power supply control device having a redundancy function according to the related art include a power supply control device as described in PTL 1. PTL 1 describes a technology for implementing a redundancy function by using two power supply control integrated circuits (ICs).

Examples of another technology having a redundancy function include a technology described in PTL 2. PTL 2 describes a technology in which a redundant backup power supply circuit is prepared inside a power supply control IC, and when a main power supply circuit fails, switching to the redundant backup power supply circuit is made.

CITATION LIST

Patent Literature

PTL 1: JP 2007-259661 A
PTL 2: JP 2009-55686 A

SUMMARY OF INVENTION

Technical Problem

However, in the technology described in PTL 1 and the technology described in PTL 2, it is necessary to provide a plurality of power supply control ICs, and the number of semiconductor components mounted on the ECU is increased. As a result, the technology described in PTL 1 has a problem that an increase in size of the ECU causes an increase in cost.

In addition, for some requirements for the ECU to be developed, it is necessary to develop the power supply control IC in a customized manner, and there is a problem that a development cost of the power supply control IC incurs in addition to an ECU development cost, and when combined, it becomes a huge amount of cost.

Further, in the technology described in PTL 2, the main power supply circuit and the backup power supply circuit are separated. Therefore, in the technology described in PTL 2, the backup power supply circuit is not used during normal operation. Therefore, in the technology described in PTL 2, an unused backup power supply circuit is wasted during normal operation.

In consideration of the above problems, an object of the present invention is to provide a power supply control device capable of reducing the number of components while having a redundancy function.

Solution to Problem

In order to solve the above problems and achieve the object of the present invention, a power supply control device of the present invention includes: a plurality of power supply circuits; a control circuit that controls the power supply circuits; an output current monitor that monitors output currents of the power supply circuits; and a storage unit in which any one of a plurality of operation modes for controlling the power supply circuits is settable. The control circuit controls the power supply circuits based on the operation mode set in the storage unit and the output currents monitored by the output current monitor.

Advantageous Effects of Invention

With the power supply control device having the above configuration, it is possible to reduce the number of components while having a redundancy function. As a result, the number of components of a semiconductor element mounted on an electronic control unit (ECU) can be reduced, and the size of the ECU can be reduced. Therefore, a development cost of the ECU can be reduced.

Problems, configurations, and effects other than those described above will become apparent by the following description of embodiments.

BRIEF DESCRIPTION OF DRAWINGS

FIG. 2 is a diagram illustrating a register content of a setting register circuit in the power supply control device according to the embodiment of the present invention.

FIG. 3 is a configuration diagram illustrating an operation mode register.

FIG. 4 is a configuration diagram illustrating an intelligent threshold register.

FIG. 5 is a configuration diagram illustrating an intelligent distribution destination register.

FIG. 6 is a configuration diagram illustrating an intelligent distributed current value register.

FIG. 7 is a configuration diagram illustrating a seamless threshold register.

FIG. 8 is a configuration diagram illustrating a seamless distributed current value register.

FIG. 16 is a register setting example of the power supply control device when the seamless function in the first operation mode is applied.

FIG. 19 is an integrated circuit (IC) configuration diagram of the power supply control device according to the embodiment of the present invention.

FIG. 23 is a register setting example of the power supply control device when the intelligent function in the second operation mode is applied.

FIG. 27 is a register setting example of the power supply control device when the seamless function and the intelligent function in the third operation mode are applied.

FIG. 30 is a register setting example of the power supply control device when the non-redundancy (the intelligent function is used) in the fourth operation mode is applied.

FIG. 33 is a register setting example of the power supply control device when the non-redundancy (normal operation) in a fifth operation mode is applied.

DESCRIPTION OF EMBODIMENTS

Figure 1:
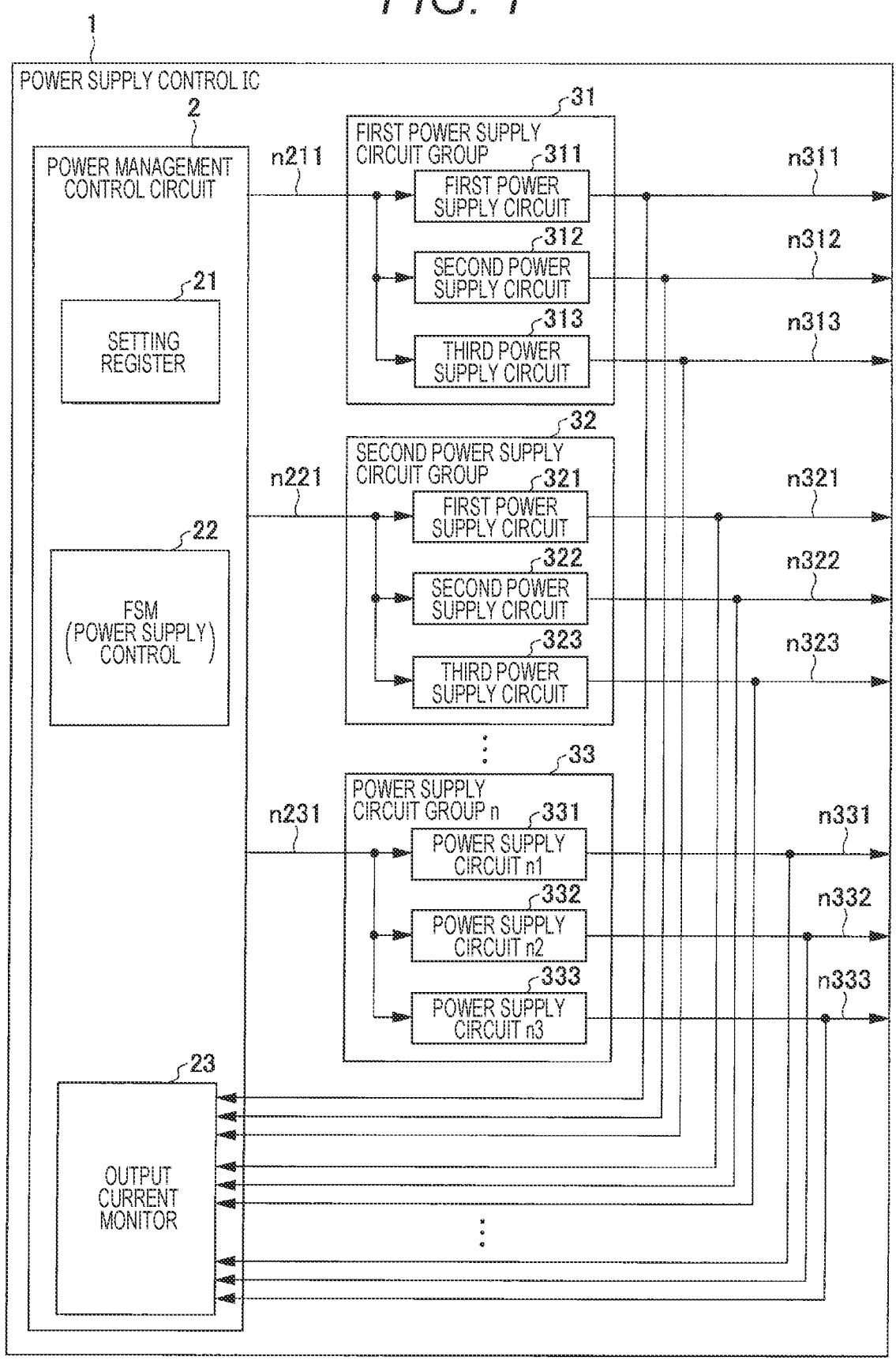
FIG. 1 is a configuration diagram illustrating a power supply control device according to an embodiment of the present invention.

Hereinafter, an embodiment of a power supply control device will be described with reference to FIGS. 1 to 35. In the drawings, the same members are denoted by the same reference signs. The same components are denoted by the same reference signs, and an overlapping description may be omitted. The drawings may be schematically illustrated as compared with the actual embodiment in order to make the description clearer, but they are merely examples and do not limit the interpretation of the present invention.

1. Embodiment

1-1. Configuration Example of Power Supply Control Device

First, a configuration of a power supply control device according to an embodiment (hereinafter, referred to as the "present embodiment") will be described with reference to FIGS. 1 to 9.

FIG. 1 is a configuration diagram illustrating the power supply control device of the present embodiment.

A power supply control device (hereinafter, referred to as a "power supply control integrated circuit (IC)") 1 of the present embodiment illustrated in FIG. 1 is a power management IC which is an integrated circuit used to perform power supply control of a semiconductor element. The power supply control IC 1 includes a power management control circuit 2 and a plurality of power supply circuit groups 31, 32, . . . , and 33.

The power management control circuit 2 includes a setting register circuit 21, a finite state machine (FSM) circuit 22, and an output current monitor 23. The setting register circuit 21 representing a storage unit is configured to be able to store a plurality of operation modes for setting an operation of the power supply control IC 1.

The FSM circuit 22 controls the operation of the power supply control IC 1. The FSM circuit 22 controls the power supply control IC 1 based on a register set in the setting register circuit 21. In addition, the FSM circuit 22 is a circuit that controls a series of operations of the power supply control IC such as register setting control for the setting register circuit 21, activation diagnosis control, power supply circuit control, control of the output current monitor 23, seamless function control, and intelligent function control.

In addition, the output current monitor 23 monitors an output current of each power supply circuit included in the power supply circuit groups 31, 32, . . . , and 33 to be described below. A value of the output current of each power supply circuit monitored by the output current monitor 23 is output to the FSM circuit 22. Then, the FSM circuit 22 compares the output current of each power supply circuit monitored by the output current monitor 23 with an intelligent threshold register value or a seamless threshold register value set in register setting, and determines to execute an intelligent function or a seamless function.

A first power supply circuit group 31 includes three power supply circuits of a first power supply circuit 311, a second power supply circuit 312, and a third power supply circuit 313. These three power supply circuits 311, 312, and 313 are connected to the setting register circuit 21 and the FSM circuit 22 of the power management control circuit 2. Then, the power supply circuits 311, 312, and 313 are controlled by the setting register circuit 21 and the FSM circuit 22 of the power management control circuit 2, and operate according to each output power supply circuit group control signal n211.

In the example illustrated in FIG. 1, one power supply circuit group control signal n211 is illustrated for simplification. However, the number of power supply circuit group control signals n is not limited to one, and the first power supply circuit group 31 and the power supply circuits 311, 312, and 313 may be controlled with a plurality of control signals.

The power supply circuits 311, 312, and 313 are connected to the output current monitor 23. Then, output currents n311, n312, and n313 of the power supply circuits 311, 312, and 313 are monitored by the output current monitor 23.

In the present embodiment, the number of power supply circuits included in the first power supply circuit group 31 is three. However, the number of power supply circuits included in the first power supply circuit group 31 is not limited to three, and may be two or four or more. It is sufficient if the number of power supply circuits included in the power supply circuit group 31 is two or more. Further, the power supply circuits 311, 312, and 313 in the first power supply circuit group 31 operate under the same voltage value.

Since the configurations of the second power supply circuit group 32 and the n-th power supply circuit group 33 are the same as the configuration of the first power supply circuit group 31, a description thereof will be omitted here.

Next, a register content set in the setting register circuit 21 will be described with reference to FIGS. 2 to 8.

FIG. 2 is a diagram illustrating the register content set in the setting register circuit 21.

As illustrated in FIG. 2, an "operation mode register", an "intelligent threshold register", an "intelligent distribution destination register", an "intelligent distributed current value register", a "seamless threshold register", and a "seamless distributed current value register" are set in the setting register circuit 21.

The "operation mode register" is a register that sets the operation mode of the power supply control IC 1. The "intelligent threshold register" is a register that sets a threshold of the output current when the intelligent function is executed. The "intelligent distribution destination register" is a register that selects a power supply circuit as a distribution destination in a non-redundancy mode (the intelligent function is used). The "intelligent distributed current value register" is a register that sets a distributed current value when the intelligent function is executed. The "seamless threshold register" is a register that sets a threshold of the output current when the seamless function is executed. The "seamless distributed current value register" is a register that sets a distributed current value when the seamless function is executed.

The register content set in the setting register circuit 21 is not limited to the example illustrated in FIG. 2.

In the following configuration diagrams of the respective registers, a bit number of the register is described with the number of power supply circuit groups being two and the number of power supply circuits mounted inside each power supply circuit group being three. The bit number of each register is not limited to the following bit numbers.

FIG. 3 is a configuration diagram illustrating the operation mode register.

As illustrated in FIG. 3, the operation mode register has five operation modes of a "redundancy mode (seamless function)", a "redundancy mode (intelligent function)", a "redundancy mode (seamless function/intelligent function)", a "non-redundancy mode (normal operation), and non-redundancy mode (the intelligent function is used)" by a 3-bit register value. When the power supply control IC 1 is manufactured and set, a user sets any one of the five operation modes. Upper one bit of the register value sets the redundancy mode or the redundancy mode. For example, when the upper one bit is 1, the redundancy mode is set, and when the upper one bit is 0, the non-redundancy mode is set. In addition, lower two bits of the register value set the seamless function, the intelligent function, the seamless function/intelligent function, or the normal operation. For example, when the lower two bits are 01, the seamless function is set, and when the lower two bits are 10, the intelligent function is set. Then, when the lower two bits are 11, the seamless function/intelligent function is set, and when the lower two bits are 00, the normal operation is set.

Here, the seamless function is an operation mode in which when it is determined that one of the plurality of power supply circuits has failed, a current is output by another power supply circuit to compensate for the failure. In addition, the intelligent function is an operation mode in which current values of the plurality of power supply circuits are combined and output as a predetermined current value. Then, the seamless function/intelligent function is an operation mode in which the above-described two functions are simultaneously executed.

FIG. 4 is a configuration diagram illustrating the intelligent threshold register.

As illustrated in FIG. 4, the intelligent threshold register is configured by five bits. Since the intelligent threshold register is required for each power supply circuit, in the present embodiment, the register is configured by five bits× the number of power supply circuits. The current threshold is set in increments of 0.1 A from 0 A to 2.0 A by the register value. In a case where a register value other than the values illustrated in FIG. 4 is not used, and an unused value is set, 0 A is selected.

FIG. 5 is a configuration diagram illustrating the intelligent distribution destination register.

As described above, since the number of power supply circuit groups is two and the number of power supply circuits mounted inside each power supply circuit group is three, the intelligent distribution destination register is configured by four bits as illustrated in FIG. 5 in consideration of a case where no distribution is performed. When upper two bits of the register value are 00, the current is not distributed. At this time, lower two bits may have any value. When the upper 2 bits of the register value are 01, the current is distributed to the power supply circuit group 31, and which power supply circuit inside the power supply circuit group 31 the current is distributed to is selected by the lower 2 bits. In a case where a register value other than the values illustrated in FIG. 5 is not used, and an unused value is set, the FSM circuit 22 selects not to perform distribution.

FIG. 6 is a configuration diagram illustrating the intelligent distributed current value register.

As illustrated in FIG. 6, in the present embodiment, the register is configured by four bits× the number of power supply circuits. Then, the current threshold is set in increments of 0.025 A from 0 A to 0.200 A by the register value. In a case where a register value other than the values illustrated in FIG. 6 is not used, and an unused value is set, 0 A is selected.

FIG. 7 is a configuration diagram illustrating the seamless threshold register.

As illustrated in FIG. 7, in the present embodiment, the register is configured by five bits×the number of power supply circuits. Similarly to the intelligent threshold register of FIG. 4, the current threshold is set in increments of 0.1 A from 0 A to 2.0 A by the register value. In a case where a register value other than the values illustrated in FIG. 7 is not used, and an unused value is set, 0 A is selected.

FIG. 8 is a configuration diagram illustrating the seamless distributed current value register.

As illustrated in FIG. 8, in the present embodiment, the register is configured by four bits×the number of power supply circuits. Similarly to the intelligent distributed current value register of FIG. 6, the current threshold is set in increments of 0.025 A from 0 A to 0.200 A by the register value. In a case where a register value other than the values illustrated in FIG. 8 is not used, and an unused value is set, 0 A is selected.

In the present embodiment, an example in which various operation modes, current thresholds, and the like are set using the respective registers illustrated in FIGS. 3 to 8 has been described, but the present invention is not limited thereto. For example, a built-in memory may be applied as the storage unit instead of the setting register circuit 21, and various operation modes, current thresholds, and the like may be set.

Next, the configurations of the power supply circuit group and the power supply circuit will be described with reference to FIGS. 9 and 10.

Figure 9:
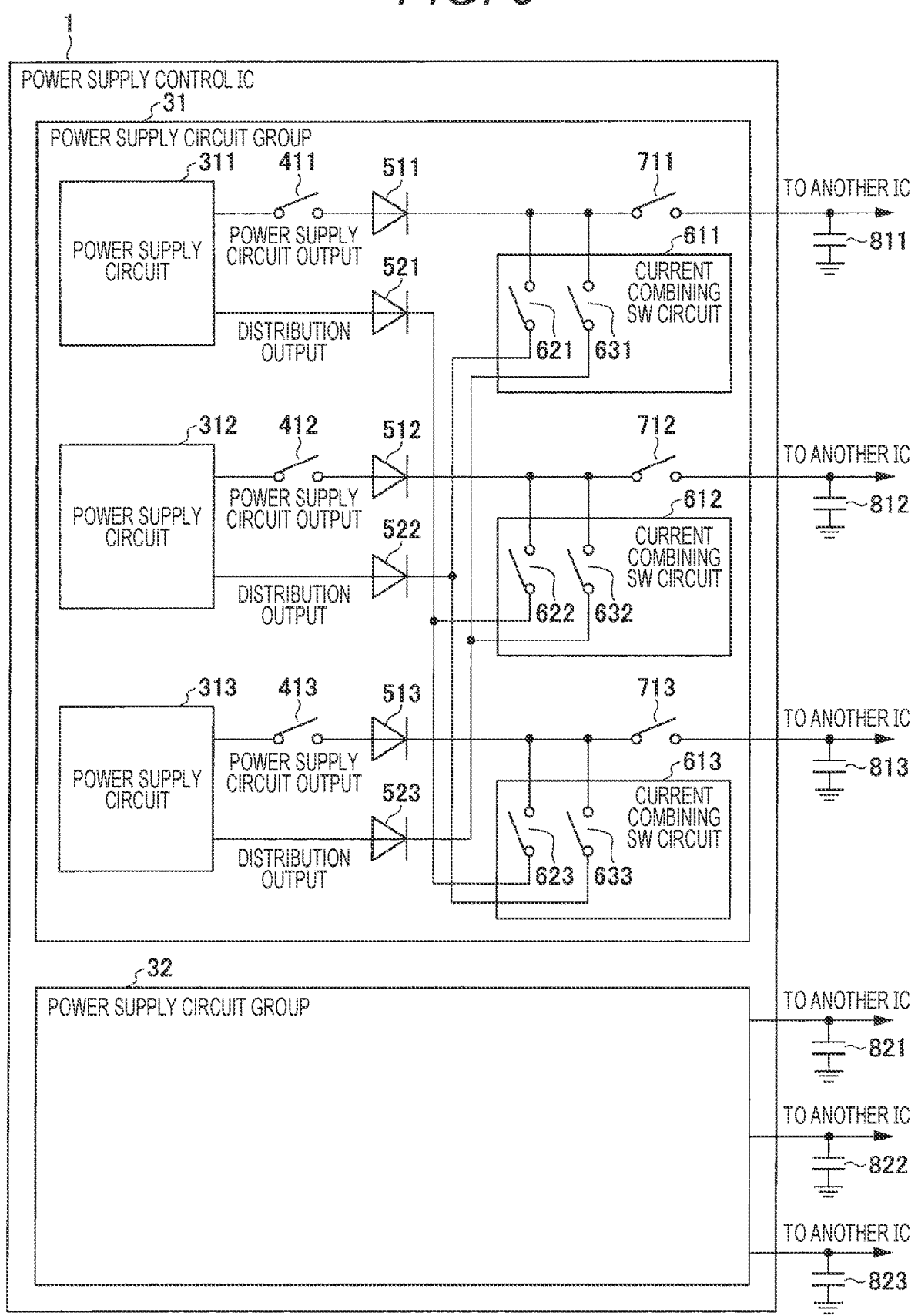
FIG. 9 is a configuration diagram illustrating a first power supply circuit group in the power supply control device according to the embodiment of the present invention.
Figure 10:
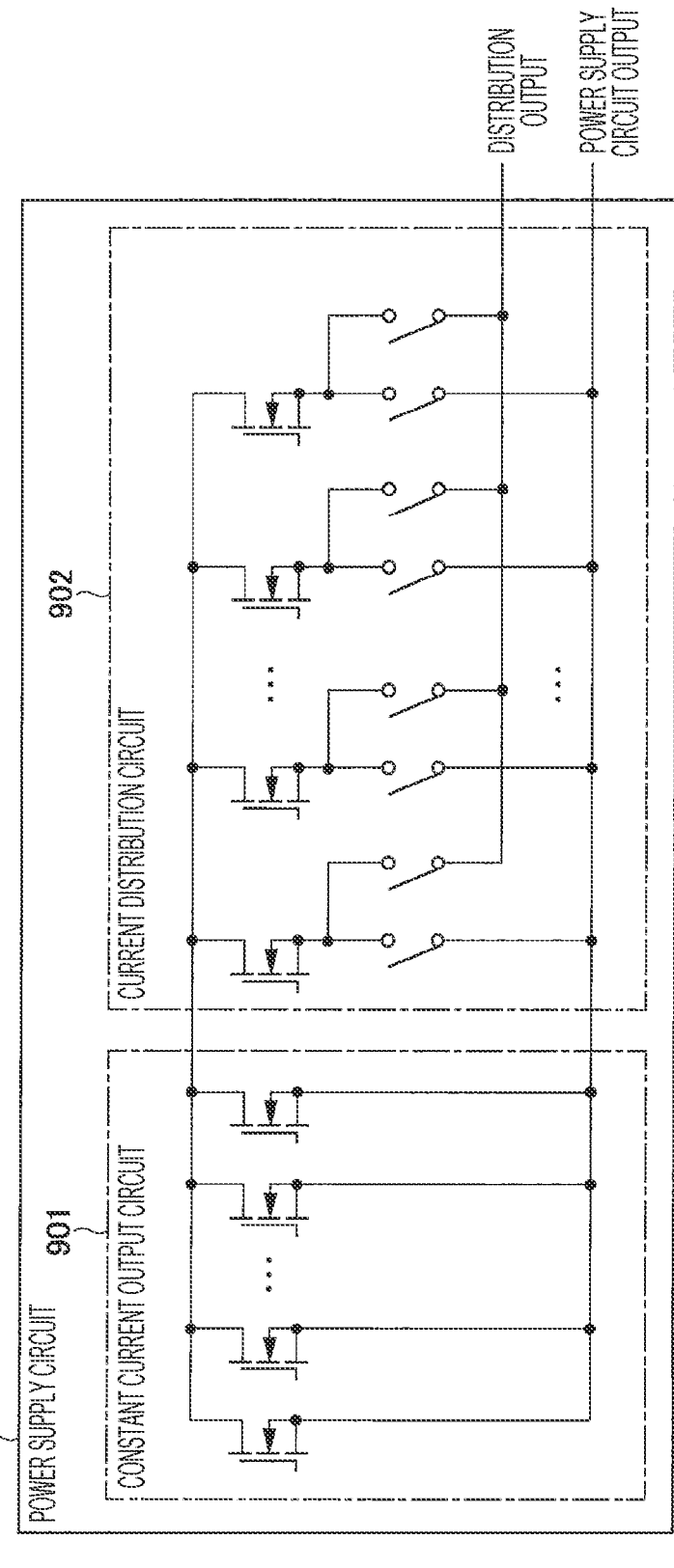
FIG. 10 is a configuration diagram illustrating a power supply circuit in the first power supply circuit group of FIG. 9.

FIG. 9 is a configuration diagram illustrating the first power supply circuit group 31, and FIG. 10 is a configuration diagram illustrating the first power supply circuit 311. The other power supply circuit groups 32 and 33 and the power supply circuits 312 and 313 have similar configurations, and thus a description thereof will be omitted.

As illustrated in FIG. 9, each of the power supply circuits 311, 312, and 313 included in the first power supply circuit group 31 has two systems of outputs including a power supply circuit output and a distribution output. The power supply circuit output of the first power supply circuit 311 includes a switch 411 and a diode 511. The switch 411 and the diode 511 constitute a diode OR circuit. As a result, the power supply circuit output can implement the seamless function at the time of failure.

The switch 411 is turned on/off in a case where the register value of the operation mode register selects the seamless function, and is in an ON state in other cases.

Then, a current combining SW circuit 611 that combines the distributed currents from the second power supply circuit 312 and the third power supply circuit 313 is provided beyond the power supply circuit output. The current combining SW circuit 611 includes two switches 621 and 631. Then, the current combining SW circuit 611 connects the switch 621 when combining the current of the first power supply circuit 311 and the distributed current from the second power supply circuit 312. In addition, the current combining SW circuit 611 connects the switch 631 when combining the current of the first power supply circuit 311 and the distributed current from the third power supply circuit 313.

The switch 621 is turned on when the intelligent function is used at the time of redundancy or non-redundancy in a case where combination with the distributed current from the second power supply circuit 312 is set by the seamless function or the intelligent function described above. Similarly to the switch 621, the switch 631 is turned on when the intelligent function is used at the time of redundancy or non-redundancy in a case where combination with the distributed current from the third power supply circuit 313 is set by the seamless function or the intelligent function described above.

In addition, a switch 711 is mounted downstream of the current combining SW circuit 611 in the power supply circuit output, that is, at an end of the power supply circuit output. When a request to stop power supply occurs due to a failure or the like in a semiconductor IC to which the power circuit output is connected, the power supply control IC 1 turns off the switch 711 and stops power supply in the IC to which the power circuit output is connected. An external element such as an electrolytic capacitor 811 is added to an output terminal of the first power supply circuit 311. As a result, it is possible to avoid instantaneous interruption of the first power supply circuit 311 when seamless processing or intelligent processing to be described below is executed.

A diode 521 is mounted on the distribution output of the first power supply circuit 311. The distribution output of the first power supply circuit 311 is connected to a current combining SW circuit 612 of the second power supply circuit 312 and a current combining SW circuit 613 of the third power supply circuit 313. The current output from the distribution output of the first power supply circuit 311 becomes the distributed currents of the second power supply circuit 312 and the third power supply circuit 313.

The configuration of the second power supply circuit 312 is the same as the configuration of the first power supply circuit 311 described above. An external element such as an electrolytic capacitor 812 for avoiding instantaneous interruption of the second power supply circuit 312 is added to an output terminal of the second power supply circuit 312. Similarly to the first power supply circuit 311, a diode 522 is mounted on the distribution output of the second power supply circuit 312. The distribution output of the second power supply circuit 312 is connected to the current combining SW circuit 611 for the first power supply circuit 311 and the current combining SW circuit 613 for the third power supply circuit 313, and is the distributed currents of these power supply circuits.

Further, the third power supply circuit 313 has the same configuration as the first power supply circuit 311 described above. An external element such as an electrolytic capacitor 813 for avoiding instantaneous interruption of the third power supply circuit 313 is added to an output terminal of the third power supply circuit 313. Similarly to the first power supply circuit 311, a diode 523 is mounted on the distribution output of the third power supply circuit 313. The distribution output of the third power supply circuit 313 is connected to the current combining SW circuit 611 for the first power supply circuit 311 and the current combining SW circuit 612 for the second power supply circuit 312, and is the distributed currents of these power supply circuits.

The circuit configuration of the first power supply circuit group 31 is not limited to the circuit configuration described above.

Next, the configuration of the first power supply circuit 311 will be described with reference to FIG. 10. As illustrated in FIG. 10, the first power supply circuit 311 includes two circuits of a constant current output circuit 901 and a current distribution circuit 902.

The constant current output circuit 901 is a circuit portion that does not depend on the distributed current in current output. In a case where the output current of the first power supply circuit 311 is 1 A and an upper limit value of the distributed current is 0.200 A, a current for 0.800 A does not depend on the distributed current. That is, the constant current output circuit 901 is a circuit that outputs a current for 0.800 A that does not depend on the distributed current.

The current distribution circuit 902 is a circuit that turns on/off each switch according to a set value of the distributed current value register and divides the current of the power supply circuit output and the current of the distribution output when the seamless function or the intelligent function is selected. For example, in a case where the distributed current value is set to the maximum value by register setting, a predetermined switch among the plurality of switches is turned off, and the remaining switches are turned on. As a result, control is performed in such a way that a current from a predetermined MOS transistor does not flow to the power supply circuit output and flows to the distribution output.

The on/off control of each switch of the current distribution circuit 902 depends on the distributed current value set by the setting register circuit 21. In a case where setting is made not to distribute the current, all the predetermined switches are turned on, and all the remaining switches are turned off, so that the same operation as that of the constant current output circuit 901 is performed.

The circuit configuration of the first power supply circuit 311 is not limited to the circuit configuration described above.

Figure 11:
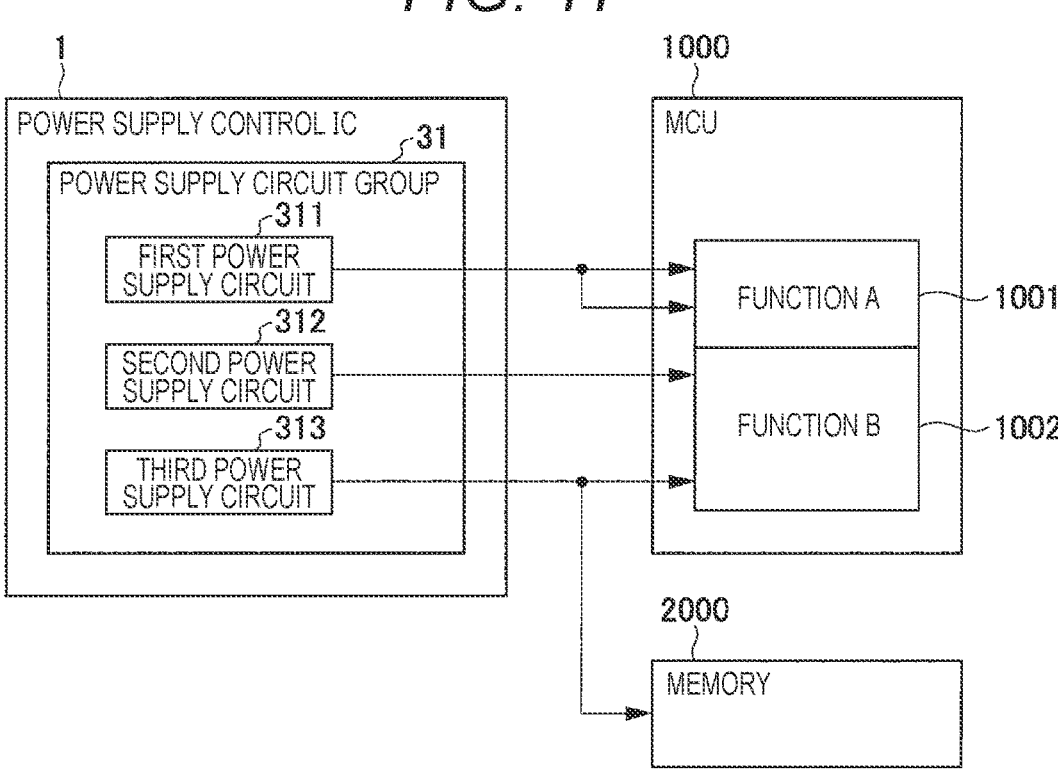
FIG. 11 is a configuration diagram when the power supply control device according to the embodiment of the present invention is connected to a micro controller unit (MCU).

FIG. 11 is a configuration diagram during the normal operation when the power supply control IC 1 of the present embodiment having the above-described configuration is connected to a micro controller unit (MCU).

As illustrated in FIG. 11, the first power supply circuit 311 of the power supply control IC 1 is connected to a function A 1001 of an MCU 1000 and supplies a current to the function A 1001. The second power supply circuit 312 is connected to a function B 1002 of the MCU 1000 and supplies a current to the function B 1002. Further, the third power supply circuit 313 is connected to the function B 1002 and an external memory 2000 of the MCU 1000, and supplies a current to the function B 1002 and the external memory 2000.

2. First Operation Mode

Next, an example in which the seamless function of the redundancy mode which is a first operation mode of the power supply control IC 1 of the present embodiment is executed will be described with reference to FIGS. 12 to 19. A current value described below is a value for describing the embodiment, and does not limit the current value.

Figure 12:
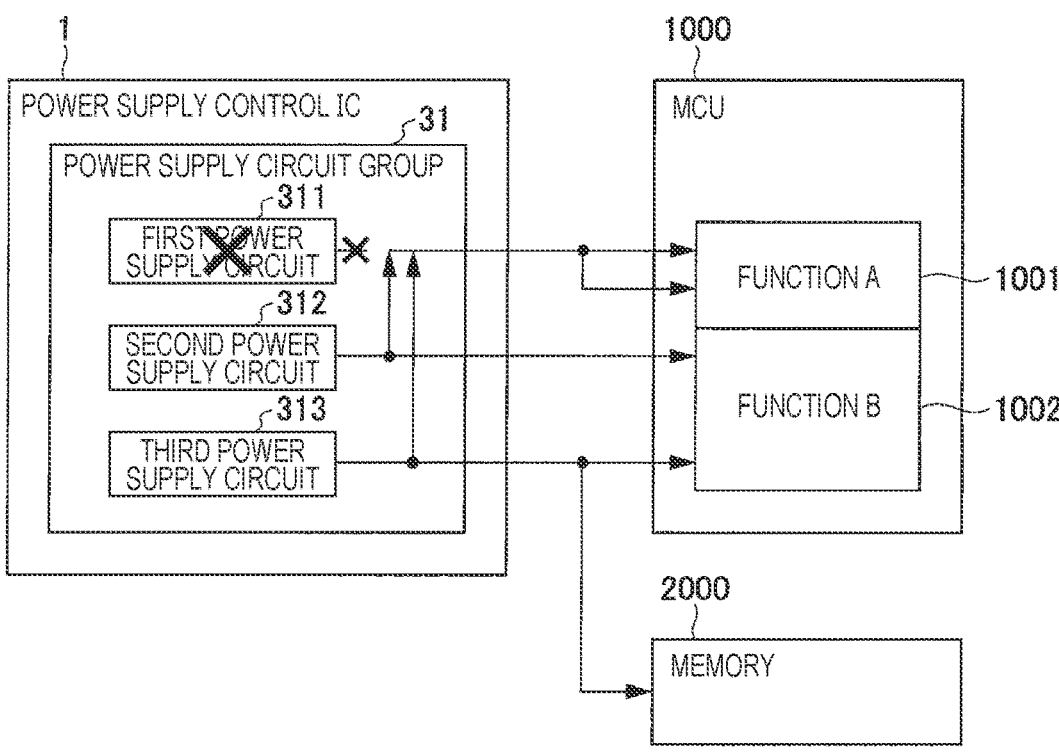
FIG. 12 is a configuration diagram of connection with the MCU when a seamless function in a first operation mode is applied.

FIG. 12 is a configuration diagram of connection with the MCU when the seamless function in the first operation mode is applied.

As illustrated in FIG. 12, when a failure occurs in the first power supply circuit 311, the power supply control IC 1 executes the seamless function. That is, a current is supplied from the second power supply circuit 312 and the third power supply circuit 313 instead of the first power supply circuit 311 to the function A 10001 of the MCU 1000. As a result, even when the current supply from the first power supply circuit 311 is stopped, the current supply to the MCU 1000 can be continued.

When the seamless function is executed, the current supplied to the MCU 1000 may be significantly reduced. Therefore, the MCU 1000 may be notified of a failure of the power supply control IC 1, and a mode for the operation of the MCU 1000 may be changed to a low power mode or the like.

Figure 13:
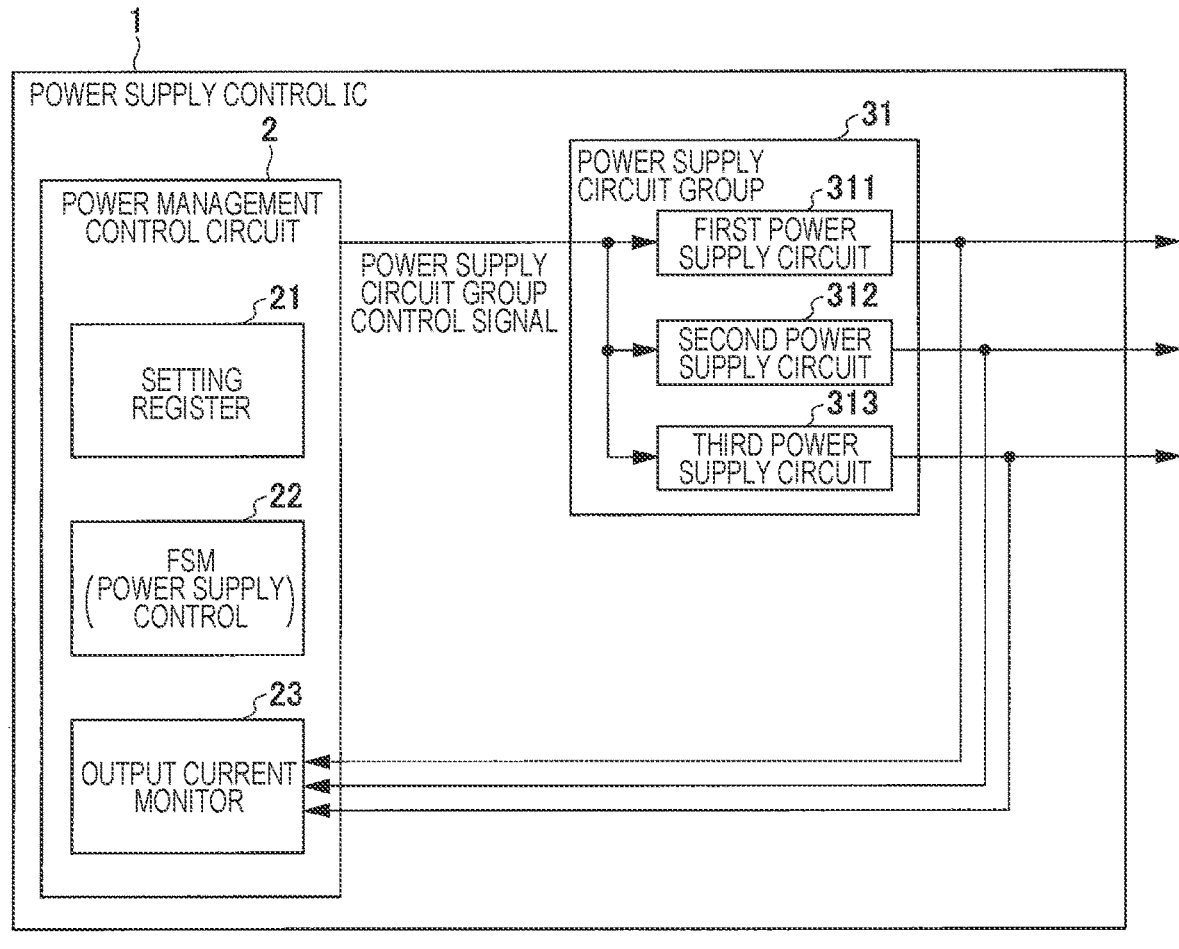
FIG. 13 is a configuration diagram of the power supply control device during normal operation.

FIG. 13 is a configuration diagram of the power supply control IC 1 during the normal operation.

As illustrated in FIG. 13, during the normal operation, a current is supplied from each of the power supply circuits 311, 312, and 313 of the first power supply circuit group 31 based on a power supply circuit control signal from the power management control circuit 2. Then, the current value of each of the power supply circuits 311, 312, and 313 is monitored by the output current monitor 23.

Figure 14:
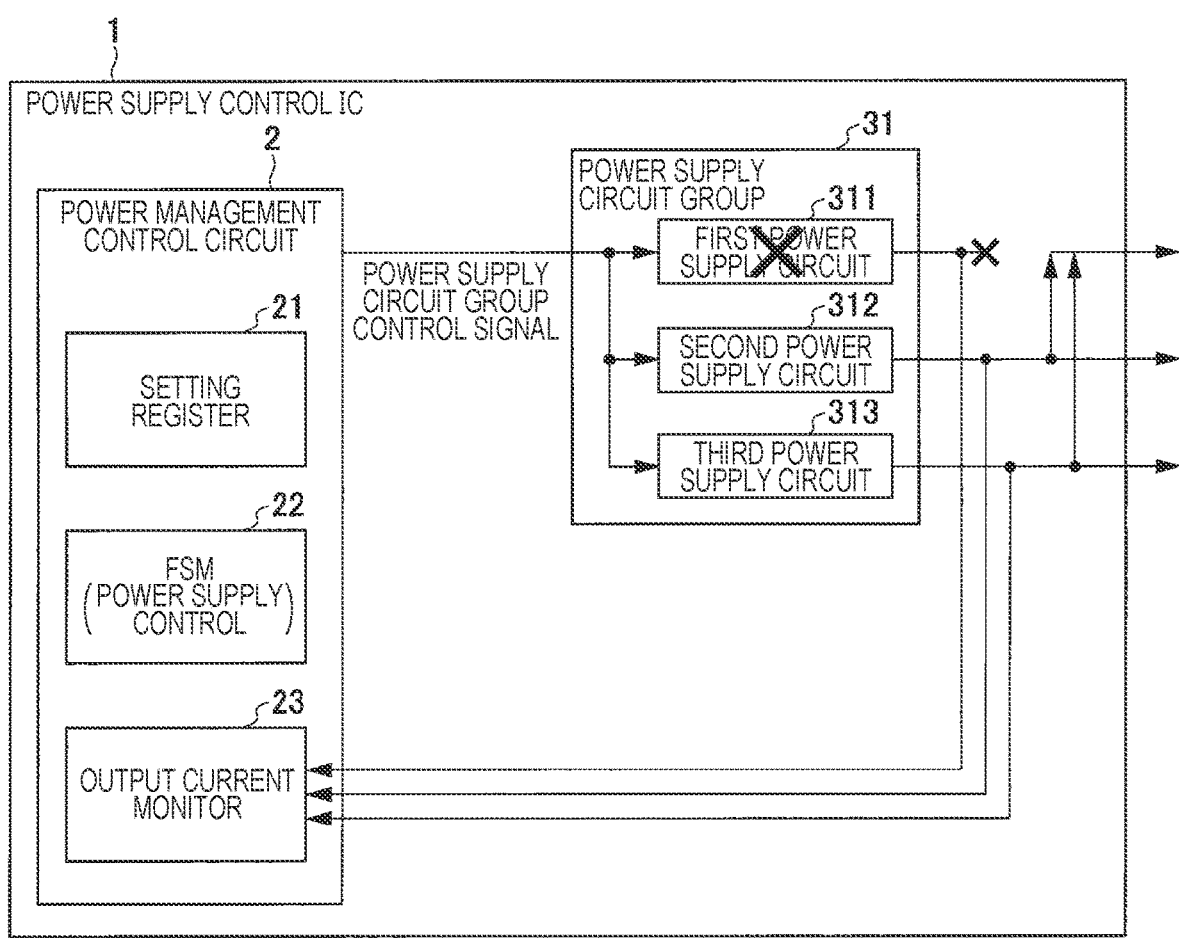
FIG. 14 is a configuration diagram of the power supply control device when the seamless function in the first operation mode is applied.

FIG. 14 is a configuration diagram of the power supply control IC 1 when the seamless function in the first operation mode is applied.

As illustrated in FIG. 14, when a failure occurs in the first power supply circuit 311, a current is distributed from the second power supply circuit 312 and the third power supply circuit 313. Also in this case, the current value of each of the power supply circuits 311, 312, and 313 is monitored by the output current monitor 23.

Figure 15:
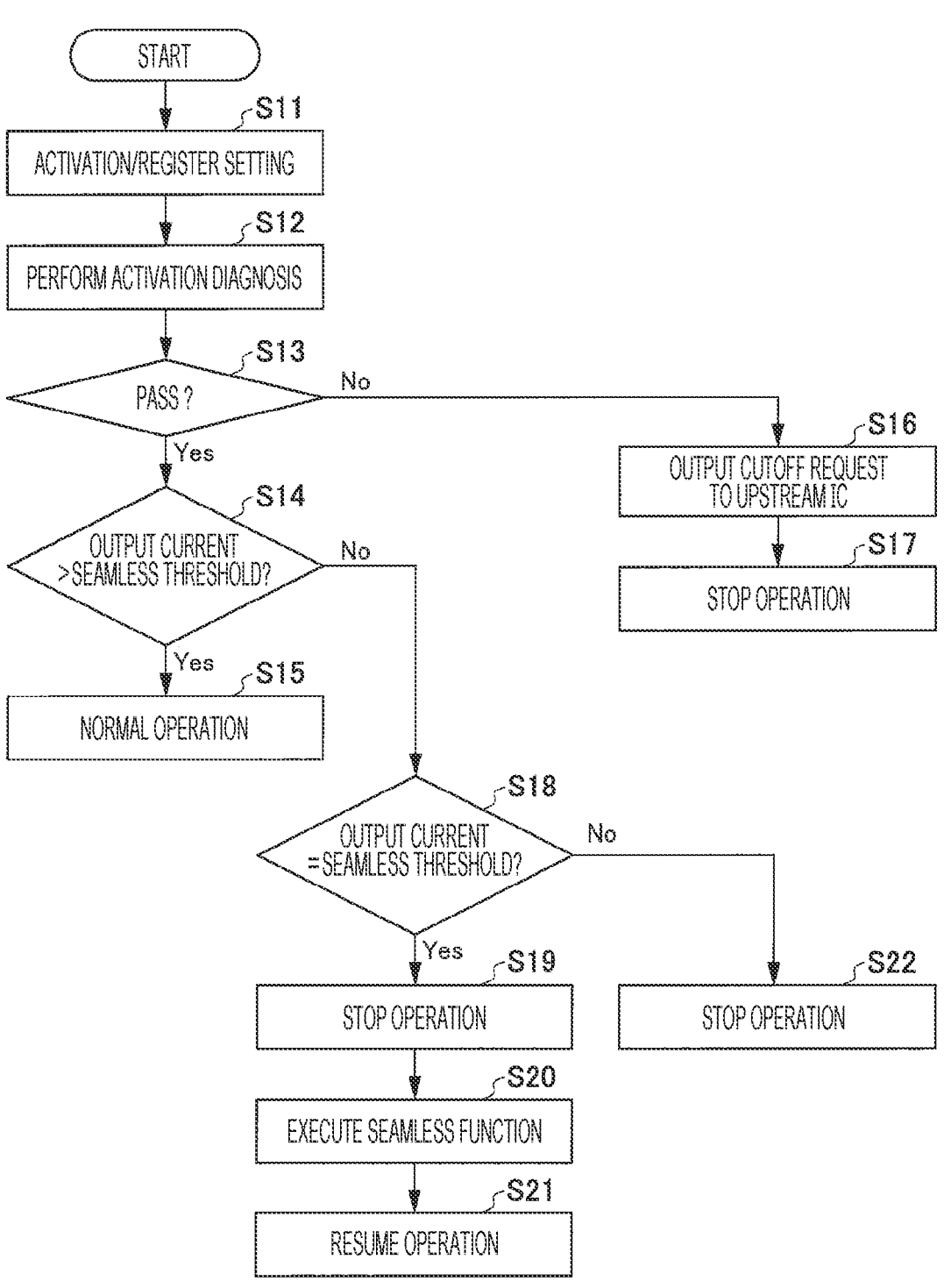
FIG. 15 is a flowchart of processing executed by a finite state machine (FSM) circuit of the power supply control device in the first operation mode.

FIG. 15 is a flowchart of processing executed by the FSM circuit 22 in the first operation mode. FIG. 16 is a register setting example in the first operation mode.

As illustrated in FIG. 15, first, when the power supply control IC 1 is activated, the FSM circuit 22 reads various register values set in the setting register circuit 21 (step S11). As illustrated in FIG. 16, the register value of the operation mode register is set to "101". Therefore, the FSM circuit 22 determines to implement the power supply control IC 1 in the redundancy mode (seamless function) which is the first operation mode.

As described above, by reading various register values set in the setting register circuit 21 each time the power supply control IC 1 is activated, it is possible to confirm the operation mode set in the power supply control IC 1.

Next, the FSM circuit 22 performs activation diagnosis (step S12). Next, in driving diagnosis in step S12, the FSM circuit 22 confirms whether the activation diagnosis result indicates pass or fail (step S13). In a case where the FSM circuit 22 determines that the activation diagnosis result indicates pass in the processing of step S13, it is determined whether or not the output current of each of the power supply circuits 311, 312, and 313 monitored by the output current monitor 23 is larger than a seamless threshold (step S14).

Here, the register value of the seamless threshold register illustrated in FIG. 16 is set to "0101". Therefore, the FSM circuit 22 determines that a current value of the seamless threshold is 1.0 A. In the example illustrated in FIG. 16, the same value is set for all the power supply circuits, but a different value may be set for each power supply circuit.

In a case where it is determined in the processing of step S14 that the output current value is larger than the seamless threshold (Yes determination in step S14), the FSM circuit 22 implements the normal operation (step S15). On the other hand, in a case where it is determined in the processing of step S14 that the output current value is equal to or smaller than the seamless threshold (No determination in step S14), it is determined whether or not the output current value is the same as the seamless threshold (step S18).

In a case where it is determined that in the processing of step S18 the output current value is the same as the seamless threshold (Yes determination in step S18), the FSM circuit 22 stops the operation of the power supply control IC 1 in order to apply the seamless function (step S19). Then, the FSM circuit 22 executes the seamless function (step S20).

The register value of the seamless distributed current value register illustrated in FIG. 16 is set to "1000". Therefore, the maximum value of the distributed current value is 0.200 A. In the example illustrated in FIG. 16, the same value is set for all the power supply circuits, but a different value may be set for each power supply circuit.

Next, the FSM circuit 22 resumes the operation of the power supply control IC 1 (step S21). Although the operation of the power supply control IC 1 is temporarily stopped during the processing from step S19 to step S21, the instantaneous interruption can be avoided by the electrolytic capacitor 813 provided at the output terminal of each of the power supply circuits 311, 312, and 313.

In a case where it is determined in the processing of step S18 that the output current value has not reached the seamless threshold (No determination in step S18), the FSM circuit 22 stops the operation since the power supply control IC 1 cannot continue the operation even if the seamless function is executed (step S22).

Further, in a case where the activation diagnosis result indicates fail in the processing of step S13, the FSM circuit 22 outputs a cutoff request to a control IC upstream of the power supply control IC (step S16). Then, the FSM circuit 22 stops the operation of the power supply control IC 1 (step S17).

Figure 17:
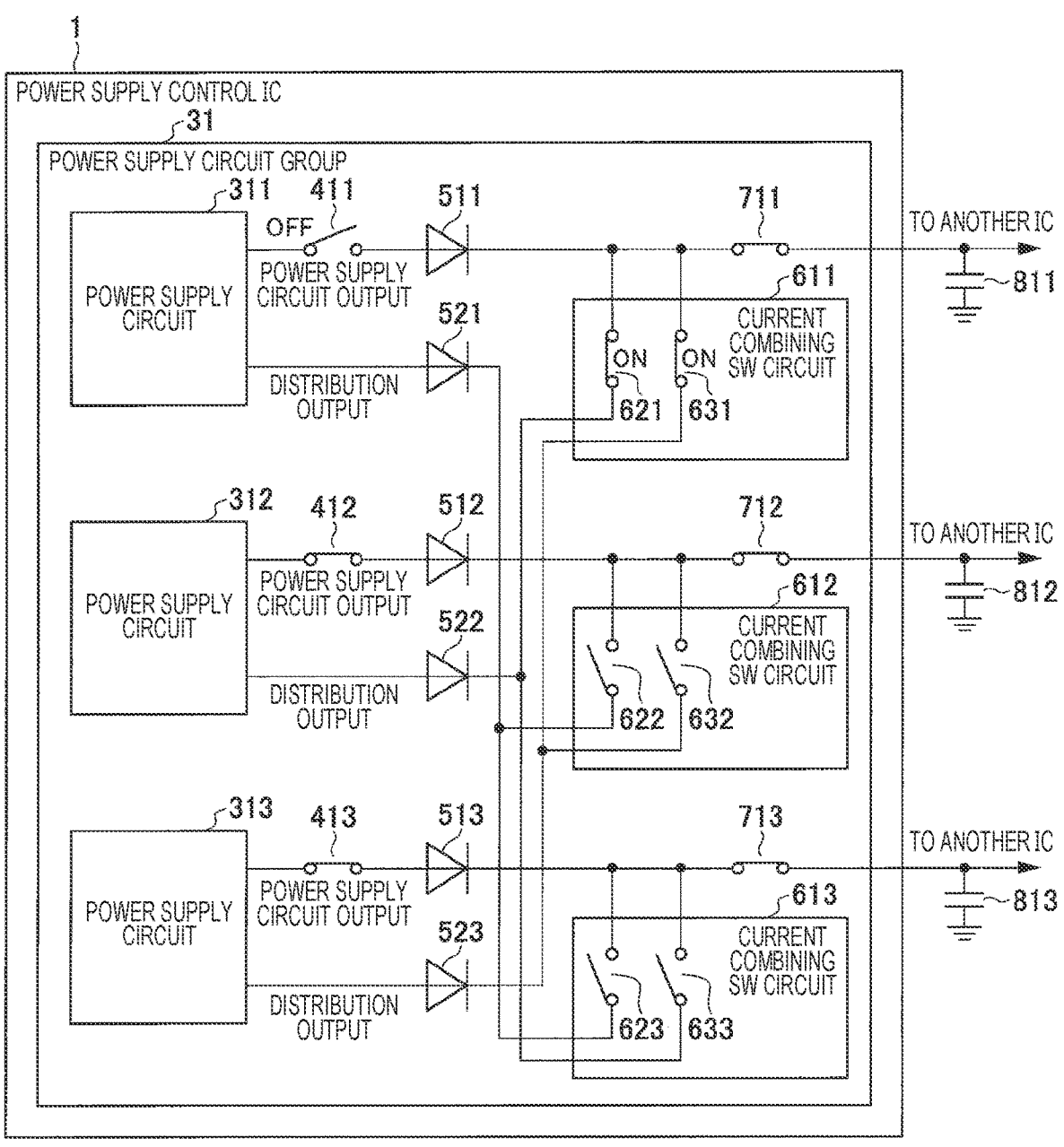
FIG. 17 is a configuration diagram of the first power supply circuit group of the power supply control device when the seamless function in the first operation mode is applied.

FIG. 17 is a configuration diagram of the first power supply circuit group 31 when the seamless function in the first operation mode is applied.

As illustrated in FIG. 17, when the seamless function is implemented, the switch 411 of the power supply circuit output of the first power supply circuit 311 is turned off. Instead, the switches 621 and 631 in the current combining SW circuit 611 for the distribution outputs of the second power supply circuit 312 and the third power supply circuit 313 are turned on, and the distributed currents from the second power supply circuit 312 and the third power supply circuit 313 are output to the first power supply circuit 311. The power supply circuit output of each of the second power supply circuit 312 and the power supply circuit 313 outputs a current even after the seamless function is executed.

As described above, the switches 711, 712, and 713 are mounted at the ends of the outputs of the power supply circuits 311, 312, and 313, respectively. This is because when a request to stop power supply occurs due to a failure or the like in a semiconductor IC to which the outputs of the power supply circuits 311, 312, and 313 are connected, the power supply control IC turns off the switches 711, 712, and 713 and stops power supply in the IC to which the outputs of the power supply circuits are connected.

Figure 18:
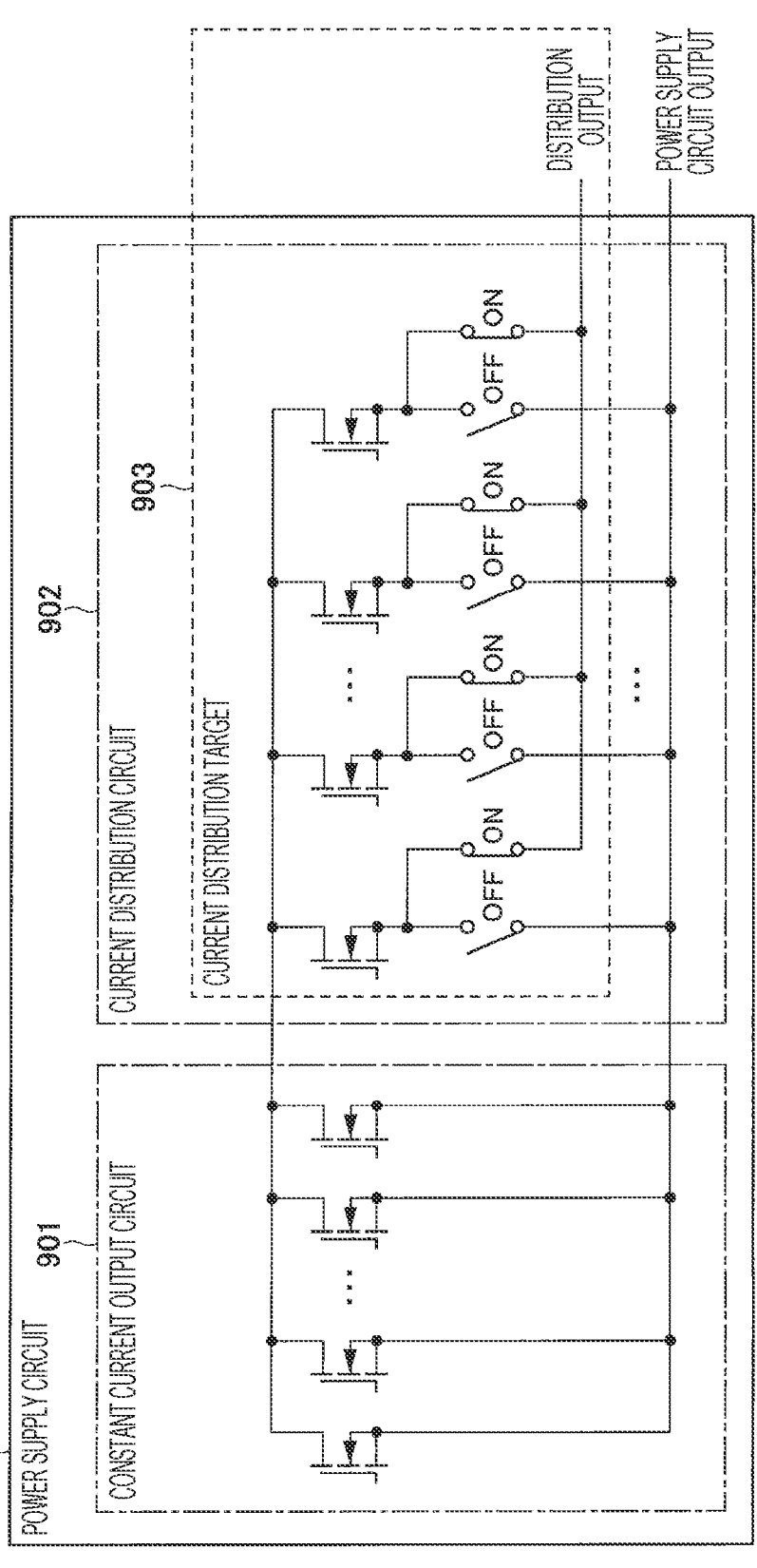
FIG. 18 is a configuration diagram of the power supply circuit of the power supply control device when the seamless function in the first operation mode is applied.

FIG. 18 is a diagram illustrating internal states of the second power supply circuit 312 and the third power supply circuit 313 when the seamless function in the first operation mode is applied. FIG. 18 only illustrates the second power supply circuit 312.

Since the second power supply circuit 312 and the third power supply circuit 313 distribute 0.200 A, which is the maximum value, to the first power supply circuit 311 according to the set value of the seamless distributed current value register illustrated in FIG. 16, the current distribution circuit 902 of the second power supply circuit 312 turns off all the predetermined switches so that a current of a predetermined MOS transistor does not flow to the power supply circuit output. Further, all the remaining switches are turned on, and currents from the MOS transistors are output to the distribution output.

FIG. 19 is an IC configuration diagram of the power supply control IC 1 of the present embodiment.

As illustrated in FIG. 19, the power supply control IC 1 has a structure in which each power supply circuit is physically and electrically separated by a silicon-on-insulator (SOI) failure of each power supply circuit is structure, and a affecting prevented from another power supply circuit. Accordingly, it is possible to prevent the first power supply circuit 311, the second power supply circuit 312, and the third power supply circuit 313 from being simultaneously destroyed.

3. Second Operation Mode

Next, an example in which the intelligent function of the redundancy mode which is a second operation mode of the power supply control IC 1 of the present embodiment is executed will be described with reference to FIGS. 20 to 25. A current value described below is a value for describing the embodiment, and does not limit the current value. Since the normal operation in the second operation mode is the same as the first operation mode described above, a description thereof will be omitted.

Figure 20:
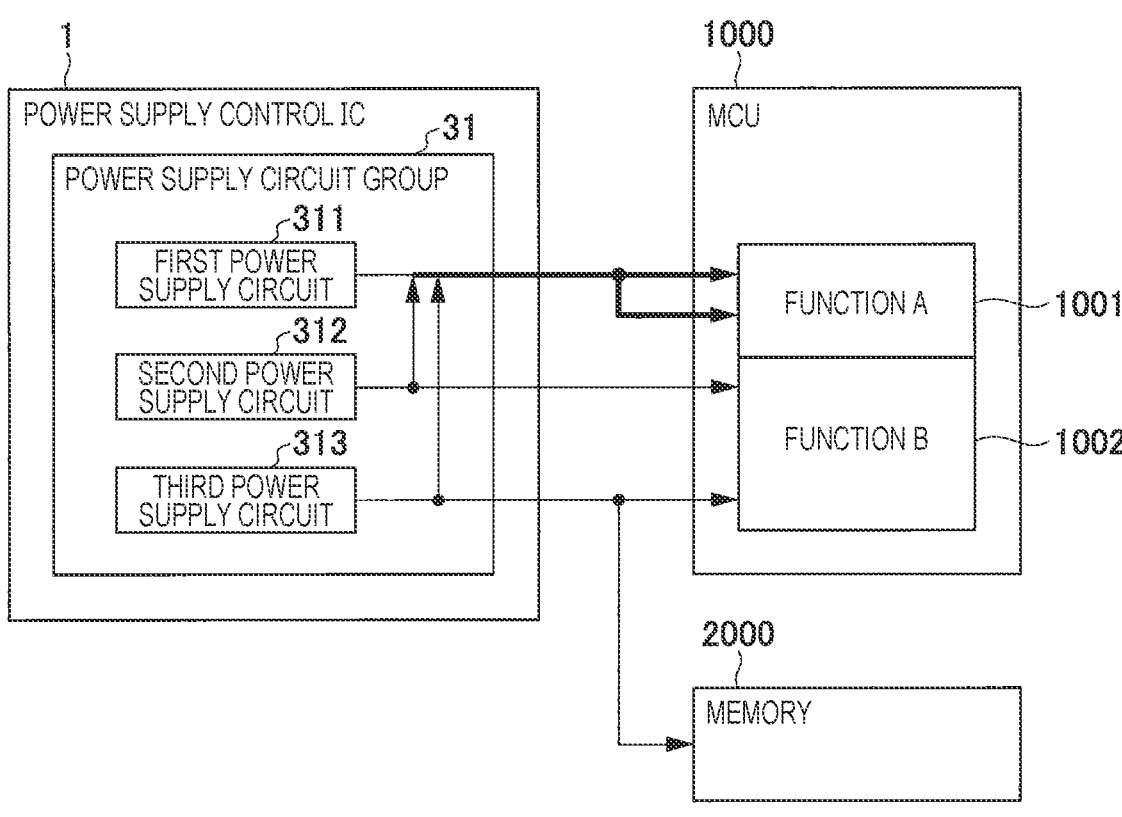
FIG. 20 is a configuration diagram of connection of the power supply control device and the MCU when an intelligent function in a second operation mode is applied.
Figure 21:
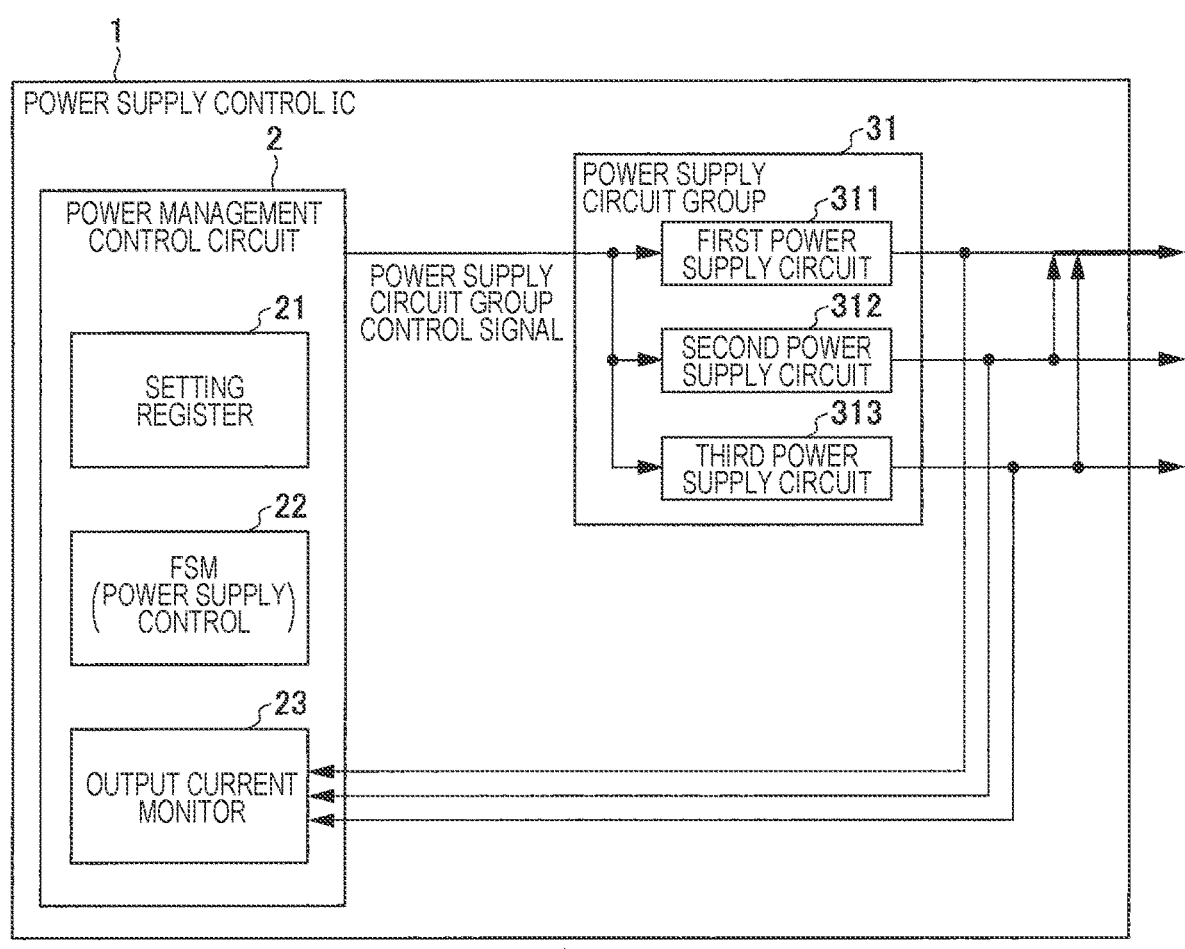
FIG. 21 is a configuration diagram of the power supply control device when the intelligent function in the second operation mode is applied.

FIG. 20 is a configuration diagram of connection with the MCU when the intelligent function in the second operation mode is applied. FIG. 21 is a configuration diagram of the power supply control IC 1 when the intelligent function in the second operation mode is applied.

As illustrated in FIGS. 20 and 21, when the intelligent function in the second operation mode is executed, the power supply control IC 1 distributes currents from the second power supply circuit 312 and the third power supply circuit 313 to the first power supply circuit 311. Then, as illustrated in FIG. 20, a current obtained by combining the currents from the three power supply circuits 311, 312, and 313 is supplied to the function A of the MCU 1000. As a result, a current value larger than a current value that can be output by one power supply circuit can be supplied.

Figure 22:
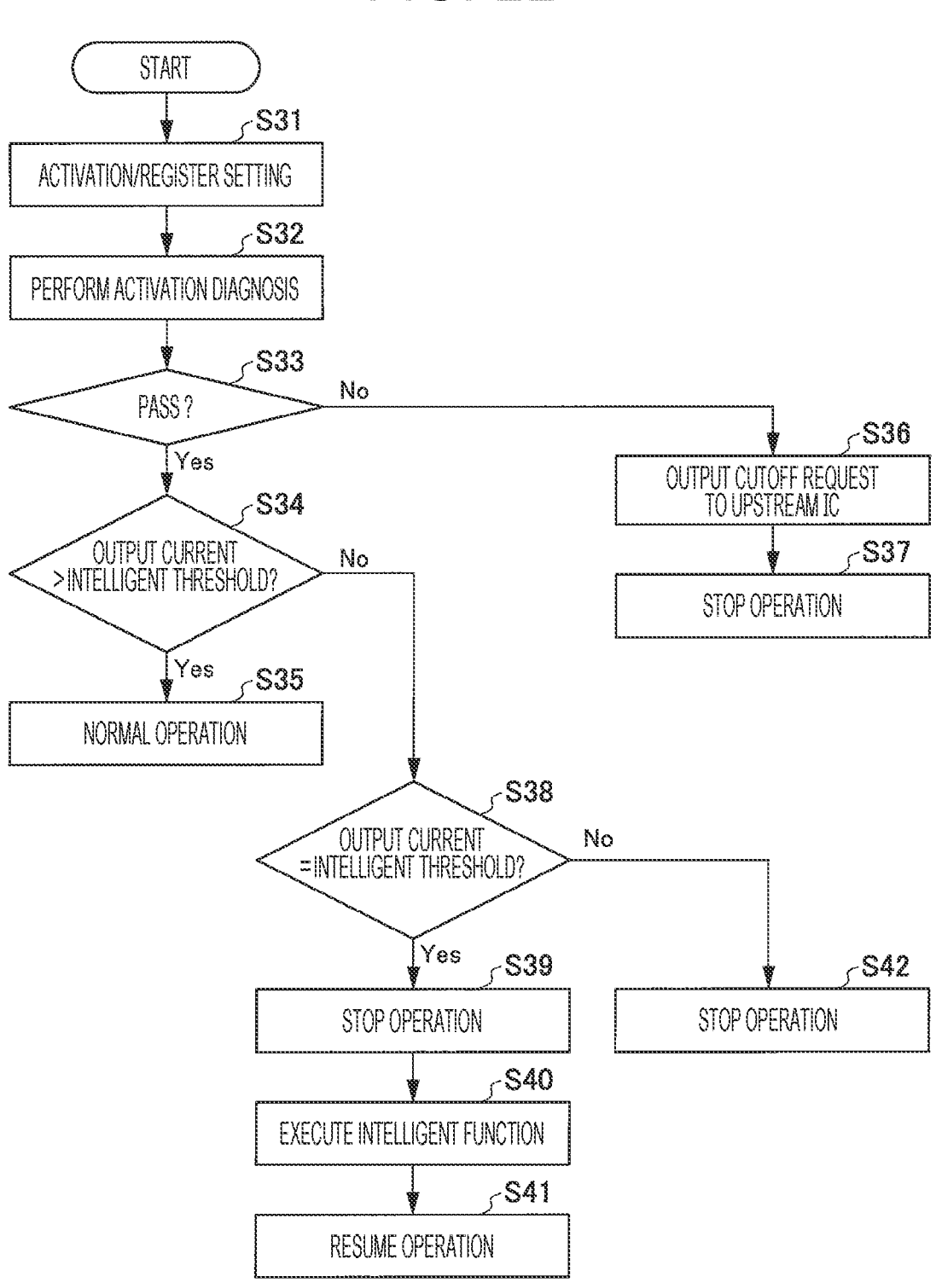
FIG. 22 is a flowchart of processing executed by the FSM circuit of the power supply control device when the intelligent function in the second operation mode is applied.

FIG. 22 is a flowchart of processing executed by the FSM circuit 22 in the second operation mode. FIG. 23 is a register setting example in the second operation mode.

As illustrated in FIG. 22, first, when the power supply control IC 1 is activated, the FSM circuit 22 reads various register values set in the setting register circuit 21 (step S31). As illustrated in FIG. 23, the register value of the operation mode register is set to "110". Therefore, the FSM circuit 22 determines to implement the power supply control IC 1 in the redundancy mode (intelligent function) which is the second operation mode.

Next, the FSM circuit 22 performs activation diagnosis (step S32). Next, in driving diagnosis in step S32, the FSM circuit 22 confirms whether the activation diagnosis result indicates pass or fail (step S33). In a case where the FSM circuit 22 determines that the activation diagnosis result indicates pass in the processing of step S33, it is determined whether or not the output current of each of the power supply circuits 311, 312, and 313 monitored by the output current monitor 23 is larger than an intelligent threshold (step S34).

Here, the register value of the intelligent threshold register illustrated in FIG. 23 is set to "10100". Therefore, the FSM circuit 22 determines that a current value of the intelligent threshold is 2.0 A. In the example illustrated in FIG. 23, the same value is set for all the power supply circuits, but a different value may be set for each power supply circuit.

In a case where it is determined in the processing of step S34 that the output current value is larger than the intelligent threshold (Yes determination in step S34), the FSM circuit 22 implements the normal operation (step S35). On the other hand, in a case where it is determined in the processing of step S34 that the output current value is equal to or smaller than the intelligent threshold (No determination in step S34), it is determined whether or not the output current value is the same as the intelligent threshold (step S38).

In a case where it is determined that in the processing of step S38 the output current value is the same as the intelligent threshold (Yes determination in step S38), the FSM circuit 22 stops the operation of the power supply control IC 1 in order to apply the intelligent function (step S39). Then, the FSM circuit 22 executes the intelligent function (step S40).

The register value of the intelligent distributed current value register illustrated in FIG. 23 is set to "0100". Therefore, the maximum value of the distributed current value is 0.100 A. In the example illustrated in FIG. 23, the same value is set for all the power supply circuits, but a different value may be set for each power supply circuit.

Next, the FSM circuit 22 resumes the operation of the power supply control IC 1 (step S41). Although the operation of the power supply control IC 1 is temporarily stopped during the processing from step S39 to step S41, the instantaneous interruption can be avoided by the electrolytic capacitor 813 provided at the output terminal of each of the power supply circuits 311, 312, and 313.

In a case where it is determined in the processing of step S38 that the output current value has not reached the intelligent threshold (No determination in step S38), the FSM circuit 22 stops the operation since the power supply control IC 1 cannot continue the operation even if the intelligent function is executed (step S42).

Further, in a case where the activation diagnosis result indicates fail in the processing of step S33, the FSM circuit 22 outputs a cutoff request to a control IC upstream of the power supply control IC (step S36). Then, the FSM circuit 22 stops the operation of the power supply control IC 1 (step S37).

Figure 24:
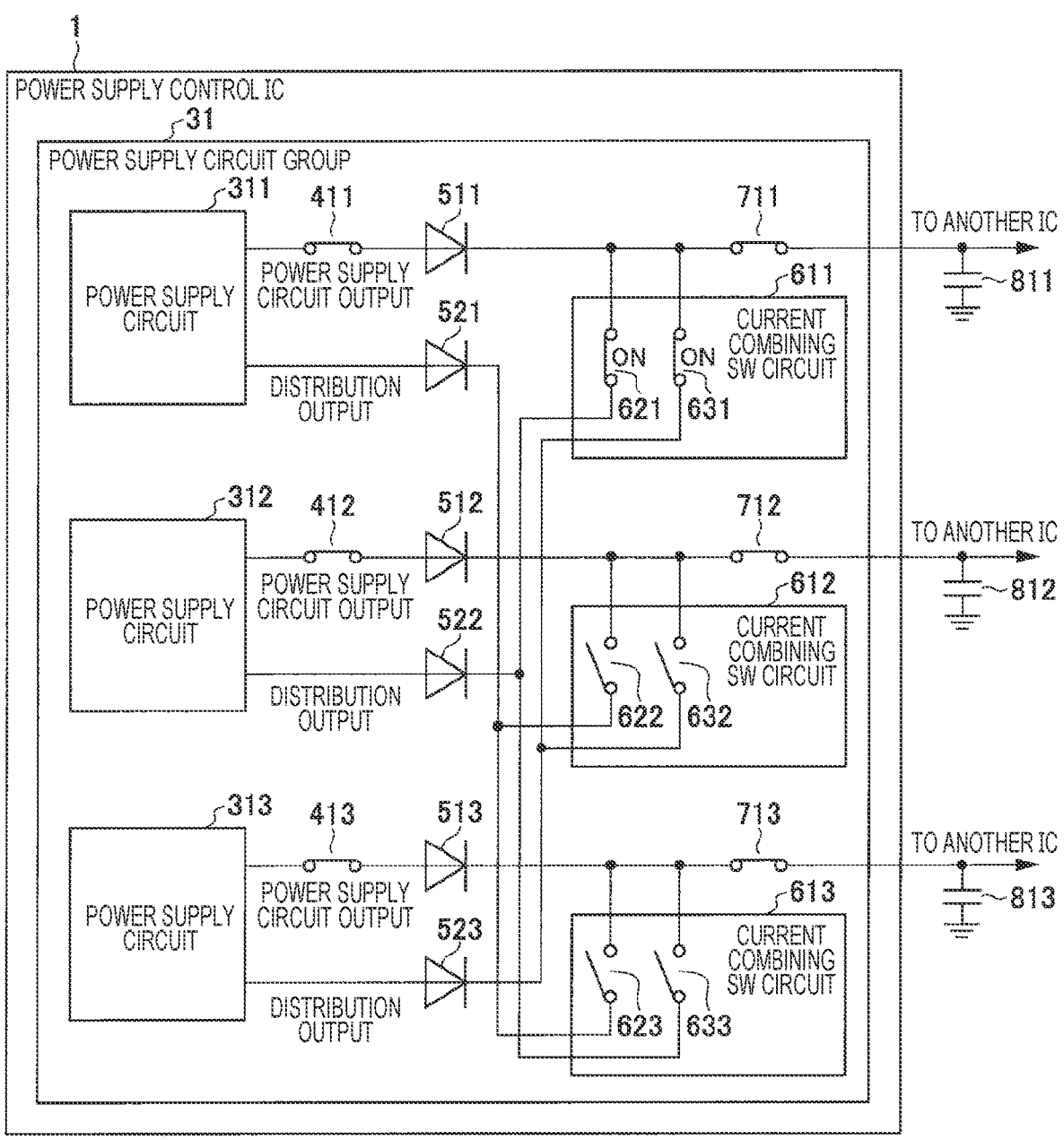
FIG. 24 is a configuration diagram of the first power supply circuit group of the power supply control device when the intelligent function in the second operation mode is applied.

FIG. 24 is a configuration diagram of the first power supply circuit group 31 when the intelligent function in the second operation mode is applied.

As illustrated in FIG. 24, when the intelligent function is executed, the switch 411 of the power supply circuit output of the first power supply circuit 311 remains in an ON state. Then, the switches 621 and 631 in the current combining SW circuit 611 for the distribution outputs of the second power supply circuit 312 and the third power supply circuit 313 are turned on, and the distributed currents from the second power supply circuit 312 and the third power supply circuit 313 are output to the first power supply circuit 311. As a result, the distributed currents from the second power supply circuit 312 and the third power supply circuit 313 are combined with the current of the first power supply circuit 311. The power supply circuit output of each of the second power supply circuit 312 and the power supply circuit 313 outputs a current even after the intelligent function is executed.

As described above, the switches 711, 712, and 713 are mounted at the ends of the outputs of the power supply circuits 311, 312, and 313, respectively. This is because when a request to stop power supply occurs due to a failure or the like in a semiconductor IC to which the outputs of the power supply circuits 311, 312, and 313 are connected, the power supply control IC turns off the switches 711, 712, and 713 and stops power supply in the IC to which the outputs of the power supply circuits are connected.

Figure 25:
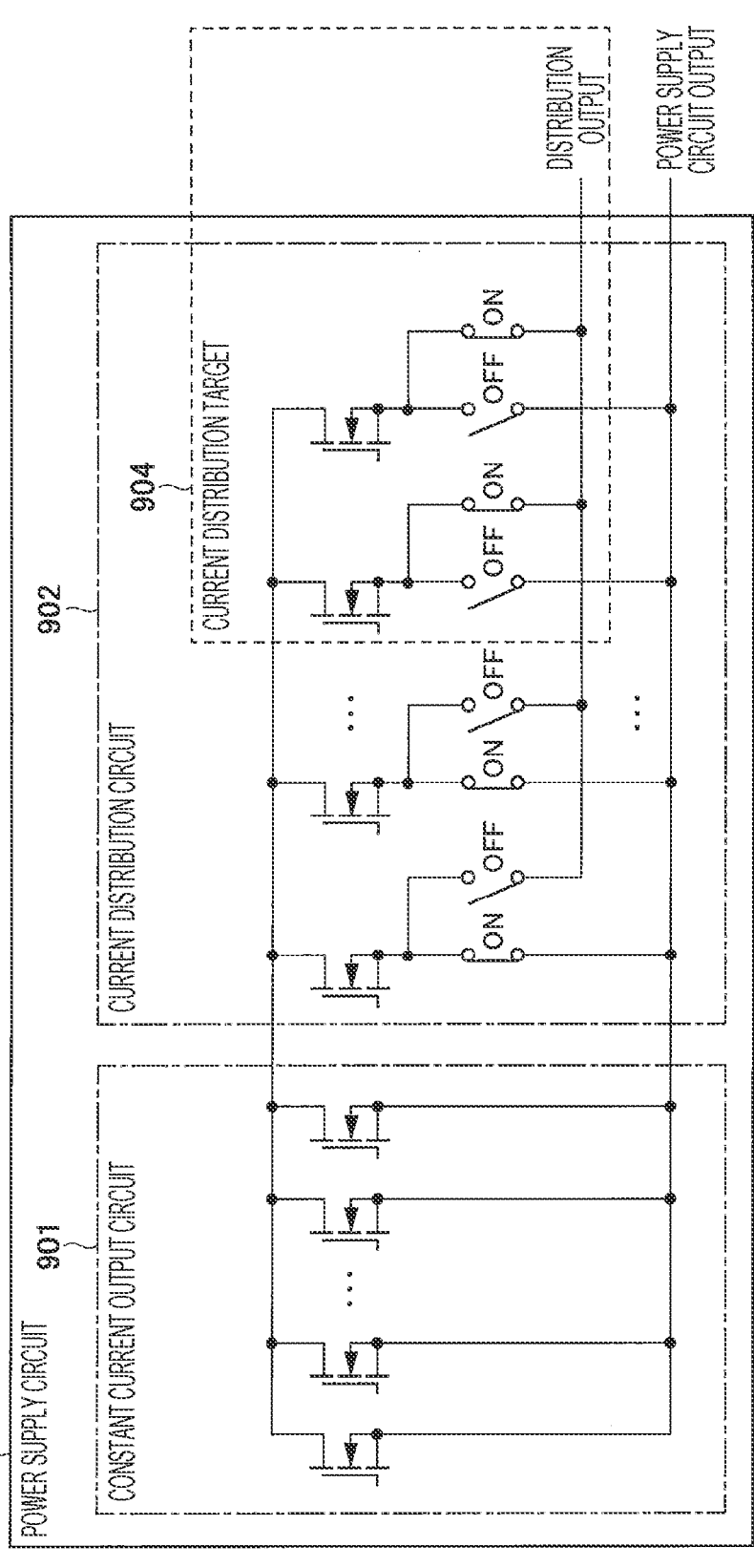
FIG. 25 is a configuration diagram of the power supply circuit of the power supply control device when the intelligent function in the second operation mode is applied.

FIG. 25 is a diagram illustrating internal states of the second power supply circuit 312 and the third power supply circuit 313 when the intelligent function in the second operation mode is applied. FIG. 25 only illustrates the second power supply circuit 312.

Since the second power supply circuit 312 and the third power supply circuit 313 distribute 0.100 A, which is half of the maximum value, to the first power supply circuit 311 according to the set value of the intelligent distributed current value register illustrated in FIG. 23, the current distribution circuit 902 of the second power supply circuit 312 turns off all the predetermined switches of a circuit in a range of a current distribution target 904 so that a current of a predetermined MOS transistor does not flow to the power supply circuit output. In addition, the remaining predetermined switches corresponding to the current distribution target 904 are turned on, and currents of predetermined MOS transistors are distributed and output.

4. Third Operation Mode

Next, an example in which the seamless function/intelligent function of the redundancy mode which is a third operation mode of the power supply control IC 1 of the present embodiment is executed will be described with reference to FIGS. 26 and 27.

In the third operation mode, one of the above-described seamless function of the redundancy mode or the above-described intelligent function of the redundancy mode is selected and executed based on a state of the output current of the power supply control IC 1. A description of a configuration common to the first operation mode and the second operation mode will be omitted. That is, in a case where the seamless function is executed, the configuration illustrated in FIG. 14 is applied as the configuration of the power supply control IC 1, and in a case where the intelligent function is executed, the configuration illustrated in 21 is applied as the configuration of the power supply control IC 1.

Figure 26:
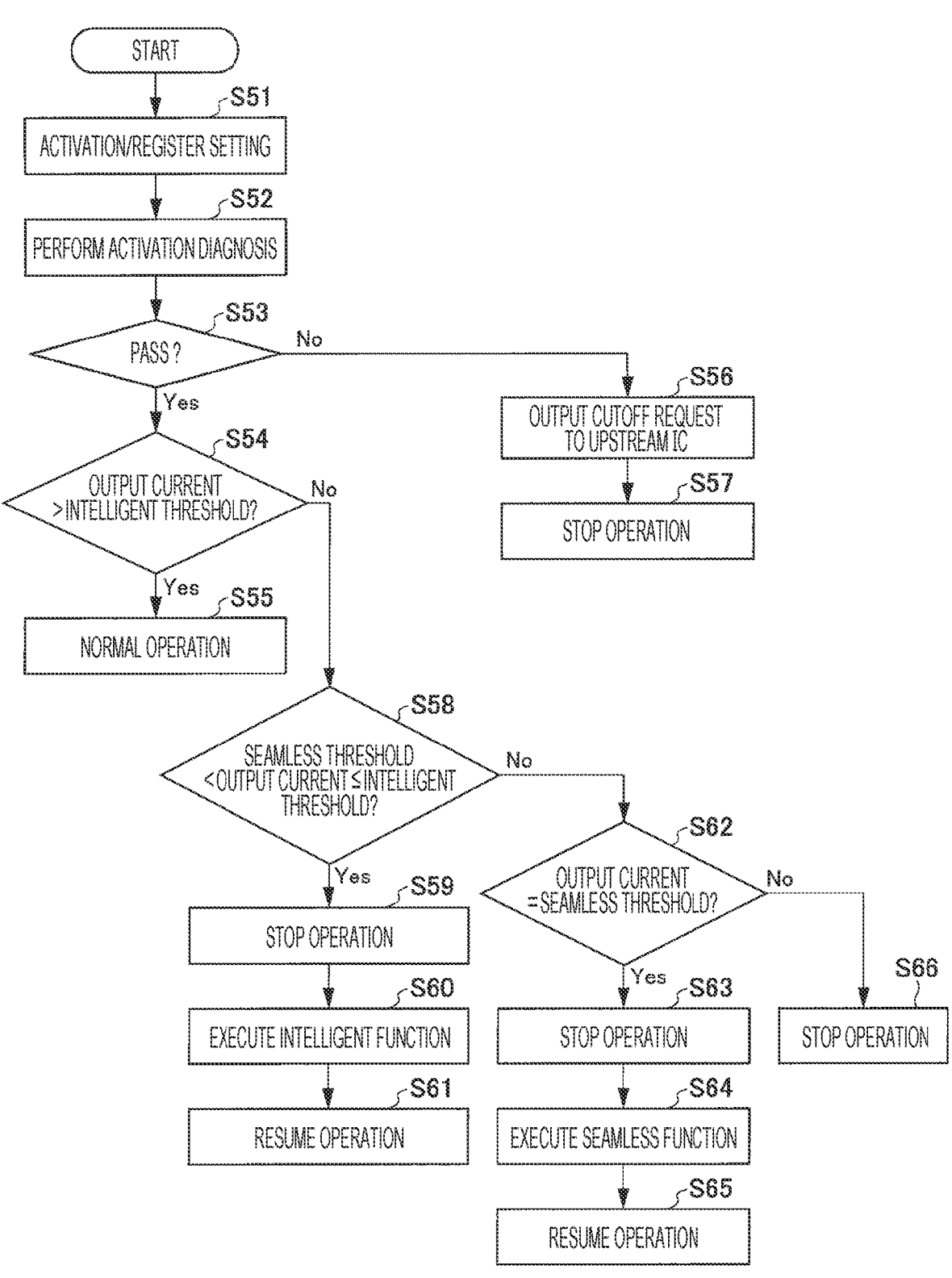
FIG. 26 is a flowchart of processing executed by the FSM circuit of the power supply control device when the seamless function and the intelligent function in a third operation mode are applied.

FIG. 26 is a flowchart of processing executed by the FSM circuit 22 in the third operation mode. FIG. 27 is a register setting example in the third operation mode.

As illustrated in FIG. 26, first, when the power supply control IC 1 is activated, the FSM circuit 22 reads various register values set in the setting register circuit 21 (step S51). As illustrated in FIG. 27, the register value of the operation mode register is set to "111". Therefore, the FSM circuit 22 determines to implement the power supply control IC 1 in the redundancy mode (seamless function/intelligent function) which is the third operation mode.

Next, the FSM circuit 22 performs activation diagnosis (step S52). Next, in driving diagnosis in step S52, the FSM circuit 22 confirms whether the activation diagnosis result indicates pass or fail (step S53). In a case where the FSM circuit 22 determines that the activation diagnosis result indicates pass in the processing of step S53, it is determined whether or not the output current of each of the power supply circuits 311, 312, and 313 monitored by the output current monitor 23 is larger than an intelligent threshold (step S54).

Here, the register value of the intelligent threshold register illustrated in FIG. 27 is set to "10100". Therefore, the FSM circuit 22 determines that a current value of the intelligent threshold is 2.0 A. In the example illustrated in FIG. 27, the same value is set for all the power supply circuits, but a different value may be set for each power supply circuit.

In a case where it is determined in the processing of step S54 that the output current value is larger than the intelligent threshold (Yes determination in step S54), the FSM circuit 22 implements the normal operation (step S55). On the other hand, in a case where it is determined in the processing of step S34 that the output current value is equal to or smaller than the intelligent threshold (No determination in step S54), it is determined whether or not the output current value is larger than the seamless threshold and equal to or smaller than the intelligent threshold (step S58).

Here, the register value of the seamless threshold register illustrated in FIG. 27 is set to "01010". Therefore, the FSM circuit 22 determines that a current value of the seamless threshold is 1.0 A. In the example illustrated in FIG. 27, the same value is set for all the power supply circuits, but a different value may be set for each power supply circuit.

In a case where it is determined in the processing of step S58 that the output current value is larger than the seamless threshold and equal to or smaller than the intelligent threshold (Yes determination in step S58), the FSM circuit 22 stops the operation of the power supply control IC 1 in order to apply the intelligent function (step S59). Then, the FSM circuit 22 executes the intelligent function (step S60). Next, the FSM circuit 22 resumes the operation of the power supply control IC 1 (step S61).

The register value of the intelligent distributed current value register illustrated in FIG. 27 is set to "0100". Therefore, the maximum value of the distributed current value is 0.100 A. In the example illustrated in FIG. 23, the same value is set for all the power supply circuits, but a different value may be set for each power supply circuit.

On the other hand, in a case where it is determined in the processing of step S58 that the output current value is equal to or smaller than the seamless threshold (No determination in step S58), the FSM circuit 22 determines whether or not the output current value is the same as the seamless threshold (step S62).

In a case where it is determined that in the processing of step S62 the output current value is the same as the seamless threshold (Yes determination in step S62), the FSM circuit 22 stops the operation of the power supply control IC 1 in order to apply the seamless function (step S63). Then, the FSM circuit 22 executes the seamless function (step S64). Next, the FSM circuit 22 resumes the operation of the power supply control IC 1 (step S65).

The register value of the seamless distributed current value register illustrated in FIG. 27 is set to "1000". Therefore, the maximum value of the distributed current value is 0.200 A. In the example illustrated in FIG. 27, the same value is set for all the power supply circuits, but a different value may be set for each power supply circuit.

In a case where it is determined in the processing of step S62 that the output current value has not reached the seamless threshold (No determination in step S62), the FSM circuit 22 stops the operation since the power supply control IC 1 cannot continue the operation even if the seamless function is executed (step S66).

Further, in a case where the activation diagnosis result indicates fail in the processing of step S53, the FSM circuit 22 outputs a cutoff request to a control IC upstream of the power supply control IC (step S56). Then, the FSM circuit 22 stops the operation of the power supply control IC 1 (step S57).

As described above, in the third operation mode, the power supply control IC 1 is operation setting that executes one of the seamless function and the intelligent function of the redundancy mode. After the activation diagnosis result indicates pass, the output current of the power supply circuit 313 is checked from the power supply circuit 311, and when the output current of the power supply circuit 311 is larger than the seamless threshold and equal to or smaller than the intelligent threshold, the operation of the power supply control IC 1 is stopped, and the intelligent function is executed. In addition, when the output current of the power supply circuit 311 reaches the seamless threshold, the operation of the power supply control IC 1 is stopped, and the seamless function is executed. After the intelligent function or the seamless function is executed, the operation of the power supply control IC 1 is resumed. In the third operation mode, the operation of the power supply control IC 1 can be controlled in stages by using two thresholds of the intelligent threshold and the seamless threshold.

5. Fourth Operation Mode

Next, an example in which the intelligent function of the non-redundancy mode which is a fourth operation mode of the power supply control IC 1 of the present embodiment is executed will be described with reference to FIGS. 28 to 32. A current value described below is a value for describing the embodiment, and does not limit the current value.

Figure 28:
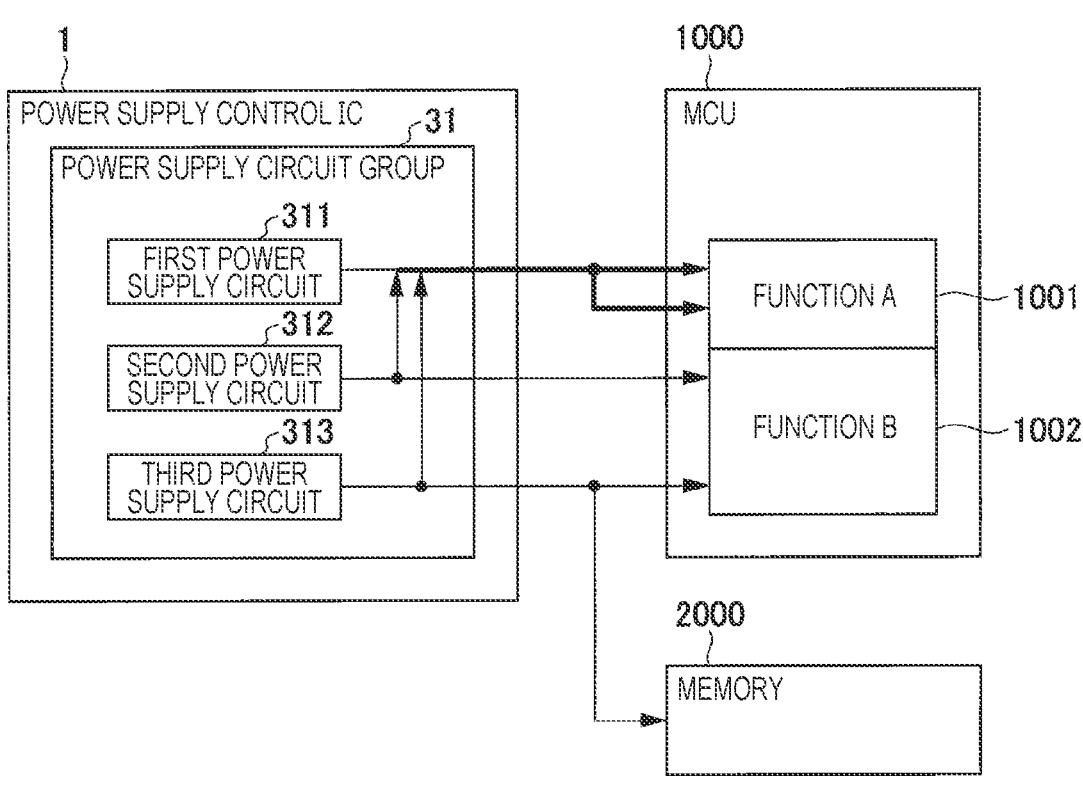
FIG. 28 is a configuration diagram of connection of the power supply control device and the MCU when non-redundancy (the intelligent function is used) in a fourth operation mode is applied.

FIG. 28 is a configuration diagram of the power supply control IC 1 when the intelligent function in the non-redundancy mode which is the fourth operation mode is applied.

As illustrated in FIG. 28, the first power supply circuit 311 uses the intelligent function to cause the second power supply circuit 312 and the third power supply circuit 313 to distribute currents, combine the currents from the three power supply circuits, and supply the combined current to the function A 1001 of the MCU 1000. The second power supply circuit 312 supplies the current to the function B 1002 of the MCU 1000. The power supply circuit 313 supplies the current to the function B 1002 of the MCU 1000 and the external memory 2000. A configuration diagram of the power supply control IC after the intelligent function is executed is the same as that of FIG. 21 of the second operation mode, and thus is omitted.

Figure 29:
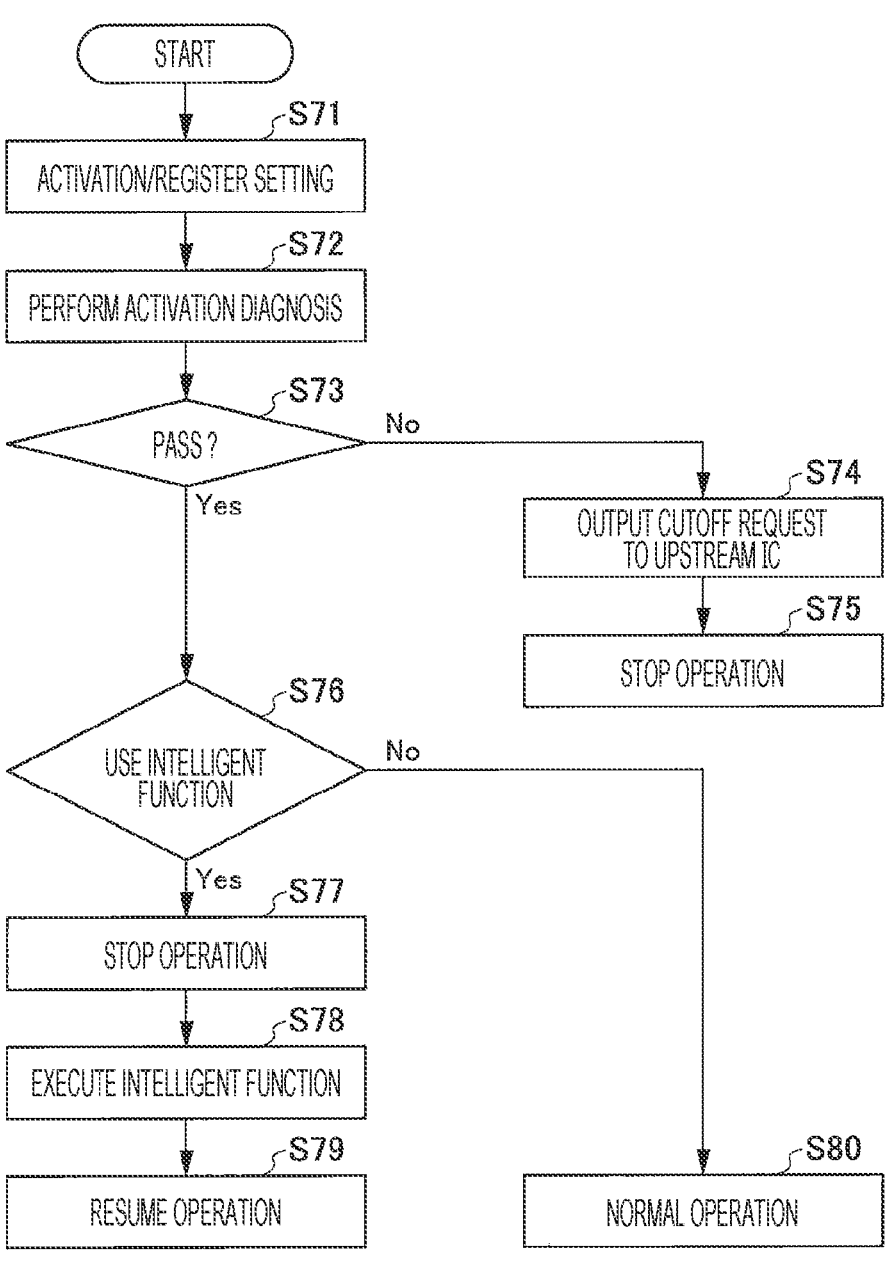
FIG. 29 is a flowchart of processing executed by the FSM circuit of the power supply control device when the non-redundancy (the intelligent function is used) in the fourth operation mode is applied.

FIG. 29 is a flowchart of processing executed by the FSM circuit 22 in the fourth operation mode. FIG. 30 is a register setting example in the fourth operation mode.

First, when the power supply control IC 1 is activated, the FSM circuit 22 reads various register values set in the setting register circuit 21 (step S71). Next, the FSM circuit 22 performs activation diagnosis (step S72). Next, in driving diagnosis in step S72, the FSM circuit 22 confirms whether the activation diagnosis result indicates pass or fail (step S73). In a case where the FSM circuit 22 determines that the activation diagnosis result indicates pass in the processing of step S73, it is determined whether or not to use the intelligent function based on the operation mode register in the setting register circuit 21 (step S76).

In a case where the register value of the operation mode register is set to "010" as illustrated in FIG. 30, the FSM circuit 22 determines to use the intelligent function in the processing of step S76 (Yes determination in step S76). Then, in order to apply the intelligent function, the FSM circuit 22 stops the operation of the power supply control IC 1 (step S77). Then, the FSM circuit 22 executes the intelligent function (step S78). Next, the FSM circuit 22 resumes the operation of the power supply control IC 1 (step S79).

The register value of the intelligent distributed current value register illustrated in FIG. 30 is set to "0100". Therefore, the maximum value of the distributed current value is 0.100 A. The intelligent distributed current value register is not set for the first power supply circuit 311. Further, in the intelligent distribution destination register, no setting is made for the first power supply circuit 311, and a register value indicating the first power supply circuit 311 that is a distribution destination power supply circuit is set for the second power supply circuit 312 and the third power supply circuit 313. Accordingly, in a case of the register value illustrated in FIG. 30, a current of 0.100 A is distributed to the first power supply circuit 311 from the second power supply circuit 312 and the third power supply circuit 313.

On the other hand, in a case where it is determined in the processing of step S76 that the intelligent function is not used (No determination in step S76), and the FSM circuit 22 implements the normal operation corresponding to a fifth operation mode to be described below (step S80).

Further, in a case where the activation diagnosis result indicates fail in the processing of step S73, the FSM circuit 22 outputs a cutoff request to a control IC upstream of the power supply control IC (step S74). Then, the FSM circuit 22 stops the operation of the power supply control IC 1 (step S75).

Figure 31:
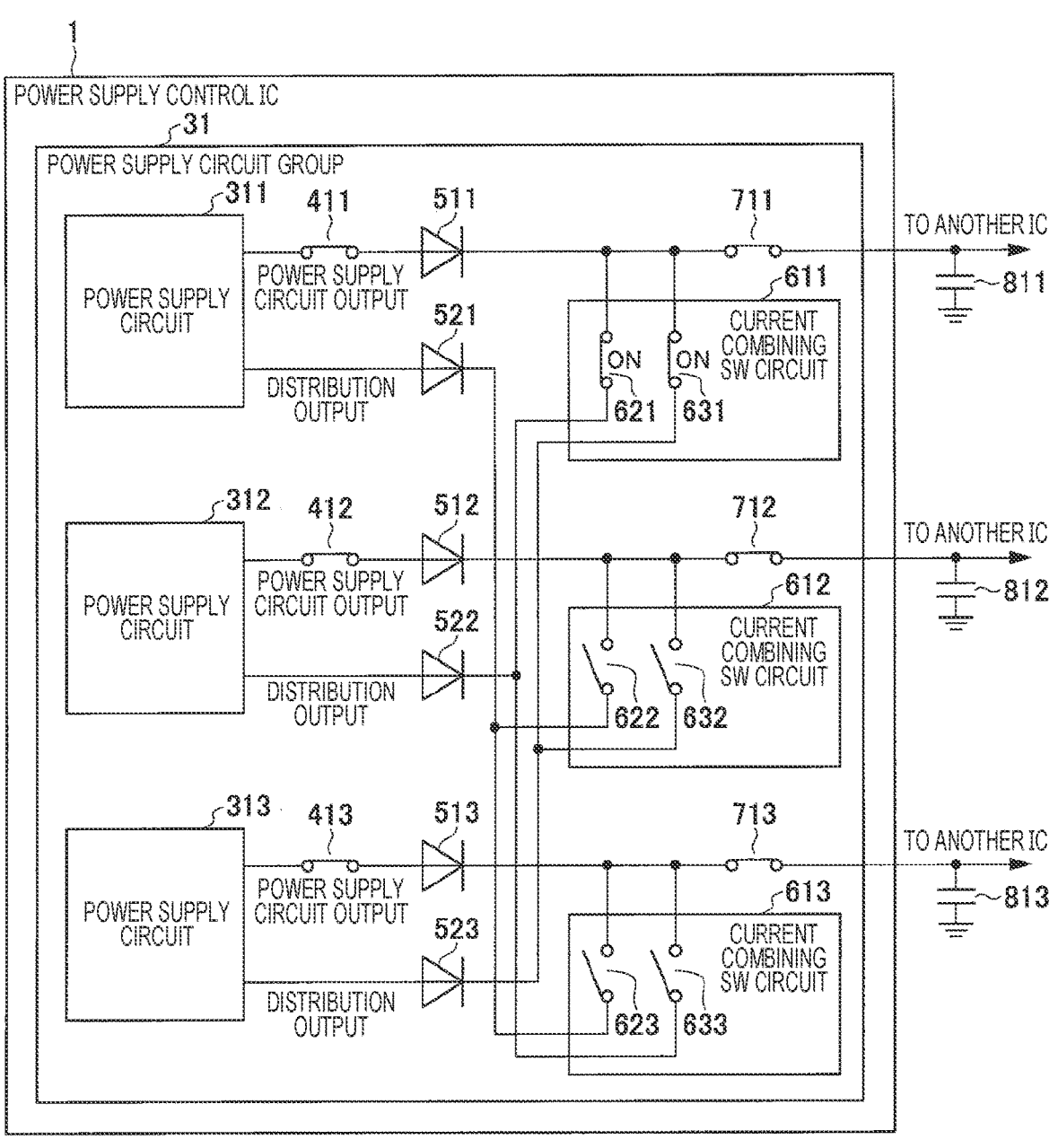
FIG. 31 is a configuration diagram of the first power supply circuit group of the power supply control device when the non-redundancy (the intelligent function is used) in the fourth operation mode is applied.

FIG. 31 is a configuration diagram of the first power supply circuit group 31 when the intelligent function in the non-redundancy mode as the fourth operation mode is applied.

As illustrated in FIG. 31, when the intelligent function is executed, the switch 411 of the power supply circuit output of the first power supply circuit 311 remains in an ON state. Then, the switches 621 and 631 in the current combining SW circuit 611 for the distribution outputs of the second power supply circuit 312 and the third power supply circuit 313 are turned on, and the distributed currents from the second power supply circuit 312 and the third power supply circuit 313 are output to the first power supply circuit 311. As a result, the distributed currents from the second power supply circuit 312 and the third power supply circuit 313 are combined with the current of the first power supply circuit 311. The power supply circuit output of each of the second power supply circuit 312 and the power supply circuit 313 outputs a current even after the intelligent function is executed.

As described above, the switches 711, 712, and 713 are mounted at the ends of the outputs of the power supply circuits 311, 312, and 313, respectively. This is because when a request to stop power supply occurs due to a failure or the like in a semiconductor IC to which the outputs of the power supply circuits 311, 312, and 313 are connected, the power supply control IC turns off the switches 711, 712, and 713 and stops power supply in the IC to which the outputs of the power supply circuits are connected.

Figure 32:
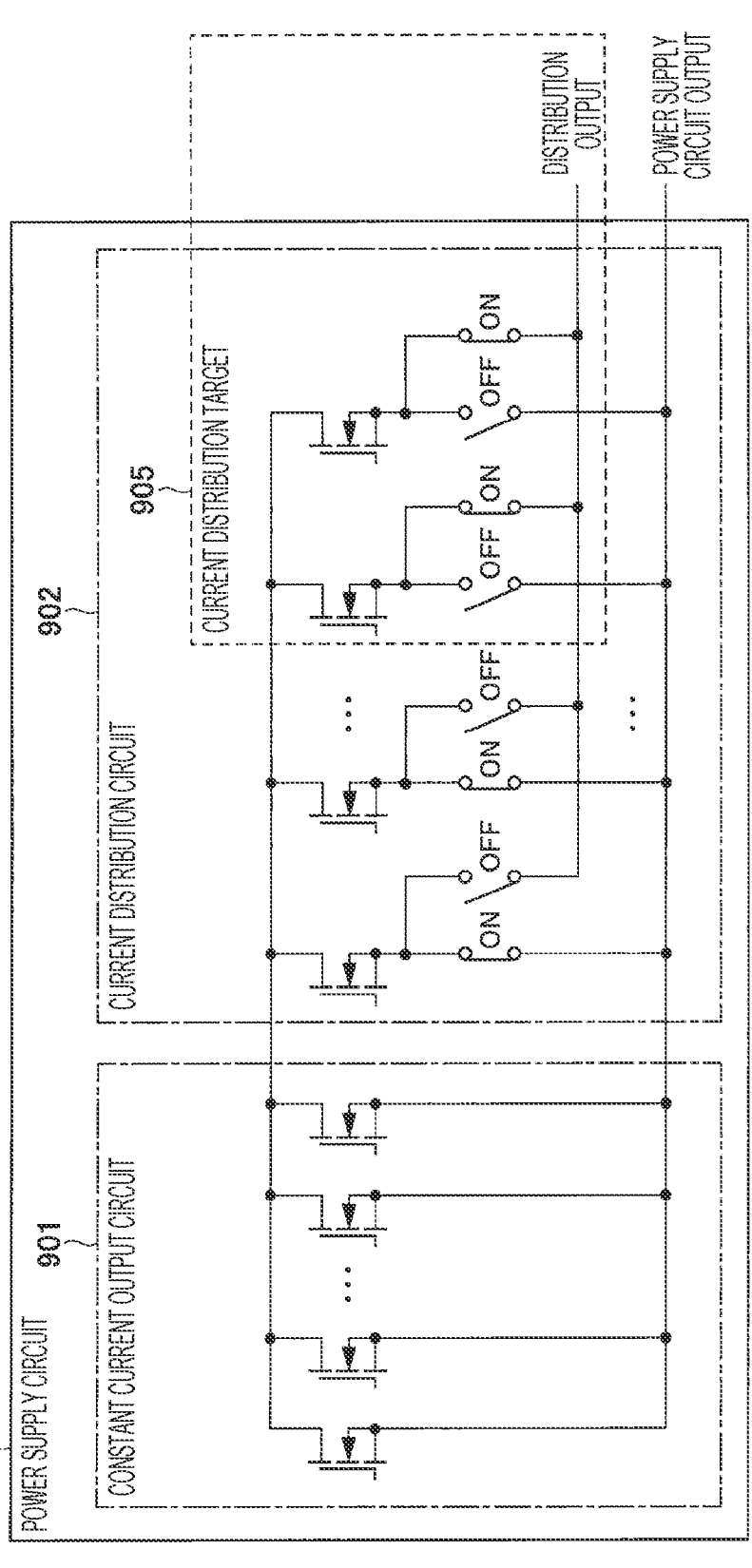
FIG. 32 is a configuration diagram of the power supply circuit of the power supply control device when the non-redundancy (the intelligent function is used) in the fourth operation mode is applied.

FIG. 32 is a diagram illustrating internal states of the second power supply circuit 312 and the third power supply circuit 313 when the intelligent function in the non-redundancy mode as the fourth operation mode is applied. FIG. 32 only illustrates the second power supply circuit 312.

Since the second power supply circuit 312 and the third power supply circuit 313 distribute 0.100 A, which is half of the maximum value, to the first power supply circuit 311 according to the set value of the intelligent distributed current value register illustrated in FIG. 30, the current distribution circuit 902 of the second power supply circuit 312 turns off all the predetermined switches of a circuit in a range of a current distribution target 904 so that a current of a predetermined MOS transistor does not flow to the power supply circuit output. In addition, the remaining predetermined switches corresponding to the current distribution target 904 are turned on, and currents of predetermined MOS transistors are distributed and output.

6. Fifth Operation Mode

Next, a normal operation mode which is the fifth operation mode of the power supply control IC 1 of the present embodiment will be described with reference to FIGS. 33 to 34. A current value described below is a value for describing the embodiment, and does not limit the current value.

In the normal operation mode, which is the fifth operation mode, as illustrated in FIG. 11, as illustrated in FIG. 11, the first power supply circuit 311 of the power supply control IC 1 is connected to the function A 1001 of the MCU 1000 and supplies a current to the function A 1001. The second power supply circuit 312 is connected to a function B 1002 of the MCU 1000 and supplies a current to the function B 1002. Further, the third power supply circuit 313 is connected to the function B 1002 and an external memory 2000 of the MCU 1000, and supplies a current to the function B 1002 and the external memory 2000.

Further, as illustrated in FIG. 13, during the normal operation, a current is supplied from each of the power supply circuits 311, 312, and 313 of the first power supply circuit group 31 based on a power supply circuit control signal from the power management control circuit 2. Then, the current value of each of the power supply circuits 311, 312, and 313 is monitored by the output current monitor 23.

FIG. 33 is a register setting example in the fifth operation mode.

As illustrated in FIG. 33, in the fifth operation mode, the register value of the operation mode register is set to "000". In addition, no setting is made for the "intelligent threshold register", the "intelligent distribution destination register", the "intelligent distributed current value register", the "seamless threshold register", and the "seamless distributed current value register".

Then, in a case where the FSM circuit 22 determines that the register value of the operation mode register in the setting register circuit 21 is "000" in the processing of step S76 in the processing flow illustrated in FIG. 29, the FSM circuit implements the normal operation mode.

Figure 34:
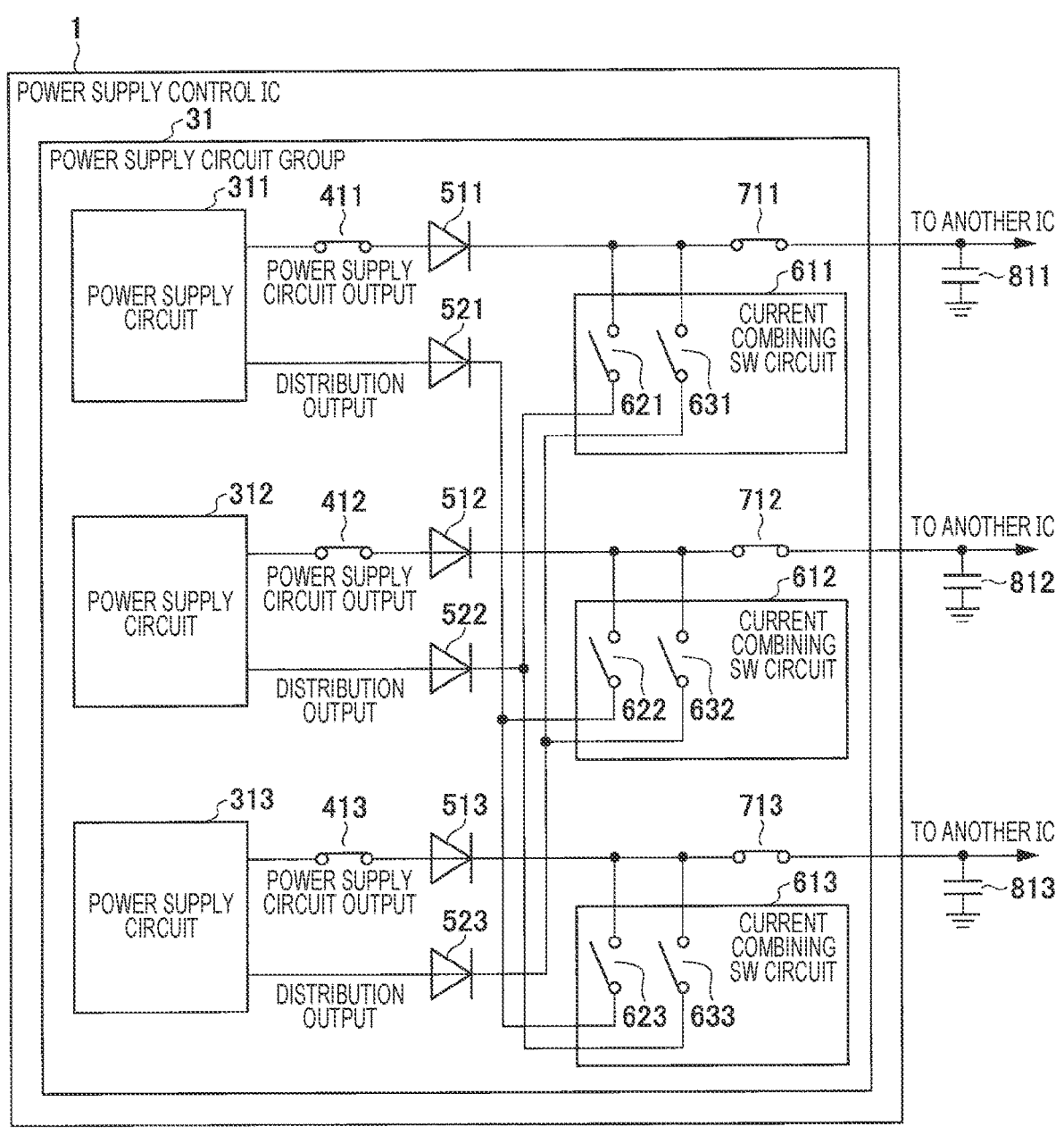
FIG. 34 is a configuration diagram of the first power supply circuit group of the power supply control device when the non-redundancy (normal operation) in the fifth operation mode is applied.

FIG. 34 is a configuration diagram of the first power supply circuit group 31 during the normal operation mode as the fifth operation mode.

As illustrated in FIG. 34, when the normal operation mode is implemented, the switch 411 of the power supply circuit output of the first power supply circuit 311 remains in an ON state. Then, the switches 621 and 631 in the current combining SW circuit 611 for the distribution outputs of the second power supply circuit 312 and the third power supply circuit 313 are turned off. Therefore, no distributed current is output from the second power supply circuit 312 and the third power supply circuit 313 to the first power supply circuit 311. Therefore, the first power supply circuit 311 outputs the power supply circuit output as it is without combining the distributed current. The power supply circuit output of each of the second power supply circuit 312 and the third power supply circuit 313 is also similar to the power supply circuit output of the first power supply circuit 311.

As described above, the switches 711, 712, and 713 are mounted at the ends of the outputs of the power supply circuits 311, 312, and 313, respectively. This is because when a request to stop power supply occurs due to a failure or the like in a semiconductor IC to which the outputs of the power supply circuits 311, 312, and 313 are connected, the power supply control IC turns off the switches 711, 712, and 713 and stops power supply in the IC to which the outputs of the power supply circuits are connected.

Figure 35:
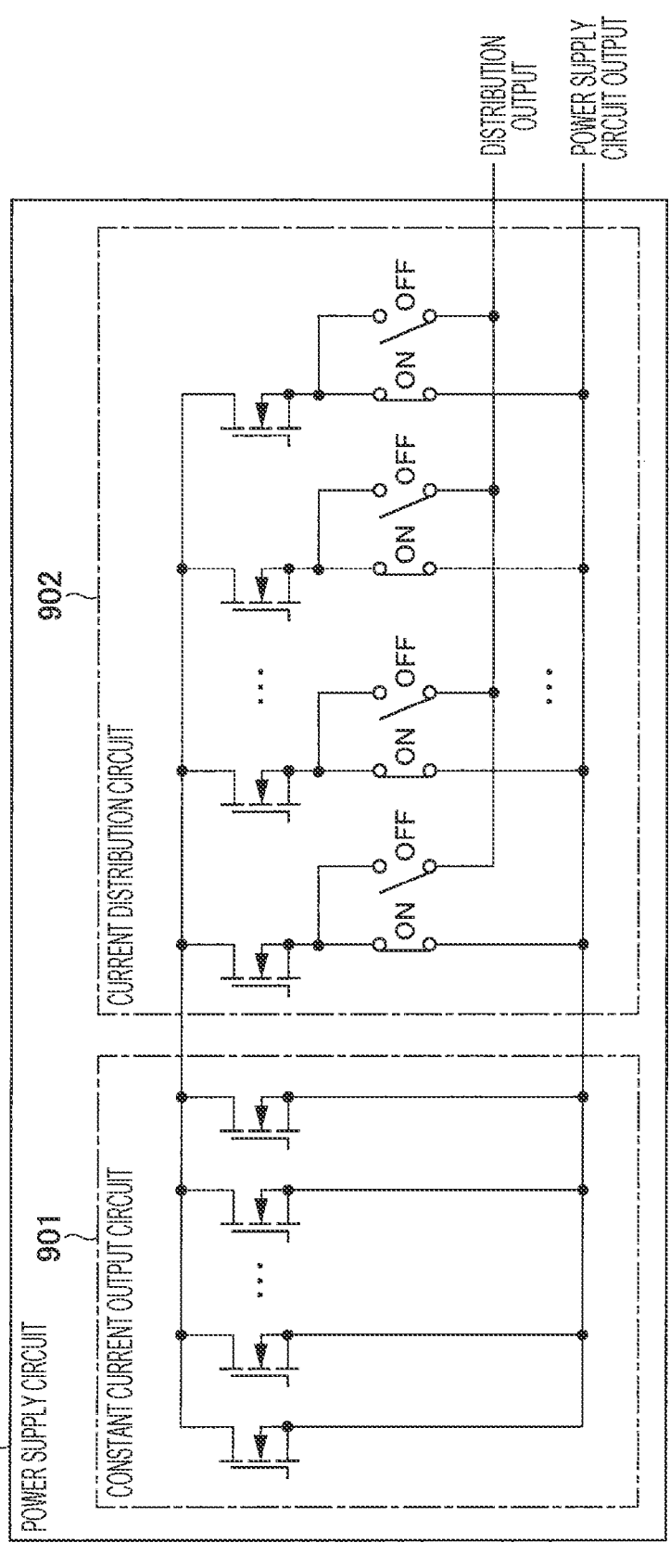
FIG. 35 is a configuration diagram of the power supply circuit of the power supply control device when the non-redundancy (normal operation) in the fifth operation mode is applied.

FIG. 35 is a diagram illustrating internal states of the second power supply circuit 312 and the third power supply circuit 313 in the normal operation mode which is the fifth operation mode. FIG. 35 only illustrates the second power supply circuit 312.

As illustrated in FIG. 35, since it is not necessary to distribute the current in the normal operation mode, all the switches connected to the distribution output are turned off so that no distribution output is output from the current distribution circuit 902. In addition, all the switches connected to the power supply circuit output are turned on so that a current flows to the power supply circuit output. That is, each switch of the current distribution circuit 902 is turned on/off so as to have the same configuration as the constant current output circuit.

As described above, in the power supply control IC 1 of the present embodiment, the setting register circuit 21 representing an example of the storage unit capable of storing a plurality of operation modes, and the output current monitor for monitoring the current values of the power supply circuits 311, 312, and 313 are provided. Based on the operation mode stored in the setting register circuit 21 and the current value monitored by the output current monitor, the FSM circuit representing an example of the control circuit controls the plurality of power supply circuits 311, 312, and 313. As a result, the redundancy function can be executed without providing a plurality of power supply control ICs. As a result, the number of components can be reduced, and the entire power supply control IC 1 can be downsized.

Furthermore, not only the operation mode but also the threshold of each operation mode and the power supply circuit as a distribution destination at the time of distribution can be arbitrarily set in the setting register circuit 21. As a result, the degree of freedom of power supply design can be increased, and the power supply control IC 1 having high versatility can be provided. As a result, it is possible to cope with various ECU development requirements, and it is possible to expand products to which the ECU using the power supply control IC 1 of the present embodiment is applied.

In addition, the power supply control IC 1 of the present embodiment uses all the plurality of power supply circuits even in the normal operation mode and the redundancy mode. As a result, it is possible to prevent a power supply circuit from becoming useless in some operation modes.

The present invention is not limited to the embodiment described above and illustrated in the drawings, and various modifications can be made without departing from the gist of the invention described in the claims.

REFERENCE SIGNS LIST

1 power supply control device (power supply control IC)
2 power management control circuit
21 setting register circuit (storage unit)
22 FSM circuit (control circuit)
23 output current monitor
31, 32, 33 power supply circuit group
311 first power supply circuit
312 second power supply circuit
313 third power supply circuit
411, 621, 631, 711 switch
611, 612, 613 current combining SW circuit (current combining circuit)
811, 812, 813 electrolytic capacitor

The invention claimed is:

1. A power supply control device comprising:
a plurality of power supply circuits, including a first, second, and third power supply circuits;
a micro controller unit having a function A, a function B, and a memory;
a control circuit that is connected to the micro controller unit and that controls the power supply circuits;
an output current monitor that monitors output currents of the power supply circuits; and
a storage unit in which any one of a plurality of operation modes for controlling the power supply circuits is settable, wherein
the control circuit controls the power supply circuits based on the operation mode set in the storage unit and the output currents monitored by the output current monitor,
the plurality of power supply circuits operate in a plurality of operation modes, including a redundancy mode in which in response to a failure of the first power supply circuit, the control circuit combines currents from the second power supply circuit and the third power supply circuit into a second combined current, and supplies the second combined current to the function A of the microcontroller unit; and
a non-redundancy mode in which:
the first power supply circuit supplies power to the function A of the microcontroller unit,
the second power supply circuit supplies power to the function B of the microcontroller unit,
the third power supply circuit supplies power to the function B of the microcontroller unit and to the memory,
and in which currents from the first power supply circuit, the second power supply circuit, and the third power supply circuit are combined into a first combined current, and the first combined current is supplied to the microcontroller unit.

2. The power supply control device according to claim 1, wherein the operation mode of the power supply circuit, a threshold of the output current, and a distribution method for the current are set in the storage unit.

3. The power supply control device according to claim 1, wherein the redundancy mode, in which the plurality of power supply circuits operate, includes a mode in which when an output current value of a first power supply circuit among the plurality of power supply circuits becomes equal to or smaller than the threshold, switching to an output from another power supply circuit to supply the function A is made.

4. The power supply control device according to claim 1, wherein the redundancy mode in which the plurality of power supply circuits operate, includes a mode in which when an output current value of a first power supply circuit among the plurality of power supply circuits becomes equal to or smaller than the threshold, an output current from another power supply circuit among the plurality of power supply circuits is combined with the output current of the first power supply circuit.

5. The power supply control device according to claim 4, wherein a current combining circuit that combines the current distributed from the other power supply circuit and the current output from the first power supply circuit is provided at an output destination of the first power supply circuit.

6. The power supply control device according to claim 1, further comprising: a semiconductor device, wherein when an inoperable failure is detected, the control circuit outputs a cutoff request to the semiconductor device.

7. The power supply control device according to claim 1, further comprising:

a semiconductor device; and a plurality of switches provided at an end of the plurality of power supply circuits, wherein the control circuit turns off the switch when a cutoff request is received from the semiconductor device.

* * * * *